US009965791B1

(12) United States Patent
Baxter et al.

(10) Patent No.: US 9,965,791 B1
(45) Date of Patent: May 8, 2018

(54) SYSTEMS, APPARATUSES, AND METHODS FOR EXTRACTING INVENTORY FROM UNSTRUCTURED ELECTRONIC MESSAGES

(71) Applicant: Tête-à-Tête, Inc., New York, NY (US)

(72) Inventors: Gillis Baxter, Sands Point, NY (US); Whitney Casey, Austin, TX (US)

(73) Assignee: TÊTE-À-TÊTE, INC., New York, NY (US)

( * ) Notice: Subject to any disclaimer, the term of this patent is extended or adjusted under 35 U.S.C. 154(b) by 0 days. days.

(21) Appl. No.: 15/582,531

(22) Filed: Apr. 28, 2017

Related U.S. Application Data

(60) Provisional application No. 62/449,184, filed on Jan. 23, 2017.

(51) Int. Cl.
G06Q 30/00 (2012.01)
G06Q 30/06 (2012.01)
H04L 12/58 (2006.01)
H04L 29/08 (2006.01)

(52) U.S. Cl.
CPC ......... G06Q 30/0625 (2013.01); H04L 51/12 (2013.01); H04L 67/22 (2013.01); H04L 67/306 (2013.01)

(58) Field of Classification Search
CPC ..... G06Q 30/0625; H04L 51/12; H04L 67/22; H04L 67/306
USPC ...................................................... 705/26–27
See application file for complete search history.

(56) References Cited

U.S. PATENT DOCUMENTS

| 5,680,528 | A | 10/1997 | Korszum |
| 6,661,433 | B1 | 12/2003 | Lee |
| 6,711,288 | B2 | 3/2004 | Kim et al. |
| 7,194,428 | B2 | 3/2007 | Wan et al. |
| 8,260,684 | B2 | 9/2012 | Flusser et al. |
| 9,519,928 | B2 | 12/2016 | Calman et al. |
| 2004/0080530 | A1 | 4/2004 | Lee |
| 2005/0159974 | A1 | 7/2005 | Moss et al. |
| 2007/0038471 | A1* | 2/2007 | Meisel ................. G06F 19/327 705/2 |

(Continued)

FOREIGN PATENT DOCUMENTS

WO 2012071576 A2 5/2012

OTHER PUBLICATIONS

MailChimp and parse partner to bring the mandrill email API to parse-powered applications (Dec. 20, 2012) Business Wire.*

(Continued)

Primary Examiner — Michael Misiaszek
Assistant Examiner — Latasha D Ramphal
(74) Attorney, Agent, or Firm — Paul McQuade; Greenberg Traurig, LLP

(57) ABSTRACT

Disclosed are systems, methods, and devices for managing a personal user inventory. In one embodiment, the method comprises retrieving a message associated with a user identifier, the message including a body content portion; identifying a parser associated with the message; parsing the body content portion using the parser to identify an item of merchandise present within the body content portion, wherein the item of merchandise is associated with an item identifier and a set of item details; associating the item of merchandise with the user identifier; and generating a display listing merchandise associated with the user identifier, wherein the listing of merchandise includes the item of merchandise.

20 Claims, 24 Drawing Sheets

(56) References Cited

U.S. PATENT DOCUMENTS

| | | |
|---|---|---|
| 2007/0179916 A1 | 8/2007 | Wan et al. |
| 2007/0225859 A1 | 9/2007 | Kolesnychenko et al. |
| 2008/0262948 A1 | 10/2008 | Grady et al. |
| 2009/0157479 A1 | 6/2009 | Caldwell et al. |
| 2010/0153204 A1 | 6/2010 | Shaw et al. |
| 2010/0191770 A1 | 7/2010 | Cho et al. |
| 2012/0047014 A1 | 2/2012 | Smadja et al. |
| 2012/0078682 A1 | 3/2012 | Pinsley et al. |
| 2012/0203760 A1 | 8/2012 | Abraham et al. |
| 2012/0330971 A1 | 12/2012 | Thomas et al. |
| 2013/0024282 A1 | 1/2013 | Kansal et al. |
| 2013/0066750 A1 | 3/2013 | Siddique et al. |
| 2013/0218784 A1 | 8/2013 | Alonzo et al. |
| 2014/0105508 A1 | 4/2014 | Arora |
| 2014/0114884 A1 | 4/2014 | Daway |
| 2014/0180864 A1 | 6/2014 | Orlov et al. |
| 2014/0180872 A1 | 6/2014 | Gura et al. |
| 2014/0279186 A1 | 9/2014 | Juan et al. |
| 2014/0379426 A1 | 12/2014 | Guo et al. |
| 2015/0019992 A1 | 1/2015 | Yu et al. |
| 2015/0066687 A1 | 3/2015 | Blackhurst et al. |
| 2015/0100467 A1* | 4/2015 | Blackhurst ............ G06Q 40/12 705/30 |
| 2016/0180427 A1 | 6/2016 | Gonzales, Jr. |
| 2017/0109594 A1* | 4/2017 | Sahagun ................ G06K 9/033 |

OTHER PUBLICATIONS

Glamoutfit, http:stuffnstyle.com (2016).
Personal Closet, https:play.google.comstoreappsdetails?id=com.personalcloset.full&hl=en (2017).
Pureple, http:www.pureple.com (2017).
Snupps, https:www.snupps.com (2011).

* cited by examiner

SYSTEMS, APPARATUSES, AND METHODS FOR EXTRACTING INVENTORY FROM UNSTRUCTURED ELECTRONIC MESSAGES

CLAIM OF PRIORITY

The present application claims priority to Prov. U.S. Pat. App. Ser. No. 62/449,184, filed Jan. 23, 2017 and entitled "Inventory Management Systems and Methods", the entire disclosure of which application is hereby incorporate herein by reference.

COPYRIGHT NOTICE

This application includes material that may be subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

Technical Field

The embodiments disclosed herein relate to the field of inventory management and, specifically, to the fields of electronic mail, image, and webpage processing.

Description of the Related Art

With the rise of electronic commerce ("e-commerce") customers are increasingly purchasing more items via websites, mobile applications, and other networked applications. Generally, current systems allow users to place orders and manage their orders (e.g., initiate returns, track packages, etc.). Thus, with current systems users may perform all aspects of online shopping that previously were limited to in-store and in-person interactions. Notably however, while current systems facilitate e-commerce, these systems suffer from numerous deficiencies.

Many current systems are, in general, isolated "silos" of information. Users are required to maintain accounts at individual merchants or with individual websites and are thus, unable to centrally manage items purchased online or "mix and match" purchases from different retailers. While some systems attempt to remedy this deficiency, these systems require users to proactively manage their own purchases (e.g., informing the system of purchases by, for example, searching for or uploading details regarding purchases).

Current systems fail to utilize the existing flows of information regarding the purchases of a user. Specifically, e-commerce orders are nearly universally associated with email messages. For example, users receive email messages when purchasing an item, when tracking deliveries, and when returning items. Additionally, a user's email account acts as "funnel" for all the user's purchases and is not limited to a single merchant or website. Thus, a user's email account acts as a rich source of information regarding e-commerce activity. Nevertheless, current systems generally do not leverage this source of information to enhance user experience.

BRIEF SUMMARY

The disclosed embodiments describe systems, methods, and devices for providing management of a user inventory based on email messages received by the user.

In one embodiment, a method comprises retrieving a message associated with a user identifier, the message including a body content portion; identifying a parser associated with the message; parsing the body content portion using the parser to identify an item of merchandise present within the body content portion, wherein the item of merchandise is associated with an item identifier and a set of item details; associating the item of merchandise with the user identifier; and generating a display listing merchandise associated with the user identifier, wherein the listing of merchandise includes the item of merchandise.

In another embodiment, a method comprises retrieving a plurality of e-mail messages associated with a user identifier; filtering the plurality of e-mail messages based on a pre-defined filter condition to obtain a set of filtered e-mail messages; selecting a first e-mail message from the filtered e-mail messages; extracting a body content portion of the first e-mail message; identifying an XSLT transform associated with the first e-mail message based on the body content portion of the first e-mail message and a sender e-mail address associated with the first e-mail message, wherein the XSLT transform identifies a location or one or more items of merchandise within the body content portion of an e-mail message; parsing the body content portion using the XSLT transform to identify an item of merchandise present within the body content portion, wherein the item of merchandise is associated with an item identifier and a set of item details; associating the item of merchandise with the user identifier; and generating a display listing merchandise associated with the user identifier, wherein the listing of merchandise includes the item of merchandise.

In another embodiment, a system comprises an application server for retrieving a message, wherein the message is associated with a user identifier and includes a body content portion; and one or more parsers for parsing the body content portion to identify an item of merchandise present within the body content portion, wherein the item of merchandise is associated with an item identifier and a set of item details, and associating, in an item database, the item of merchandise with the user identifier, wherein the application server is further configured to generate a display listing merchandise associated with the user identifier, wherein the listing of merchandise includes the item of merchandise.

The preceding features, and others, are described more fully herein.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale; emphasis instead being placed upon illustrating principles of the disclosure.

DETAILED DESCRIPTION

The present disclosure will now be described more fully hereinafter with reference to the accompanying drawings, which form a part hereof, and which show, by way of illustration, certain example embodiments.

Figure 1A:
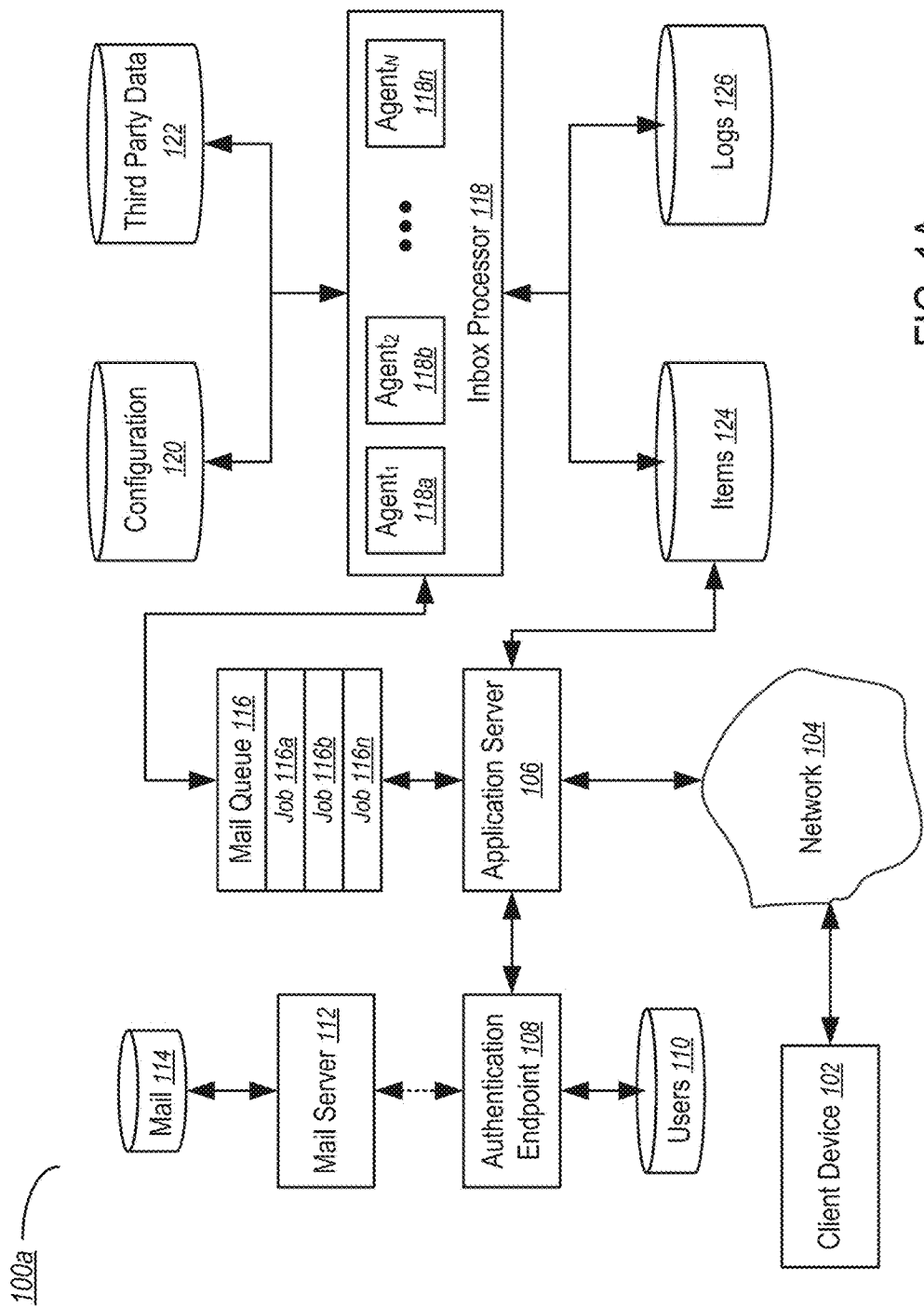
FIG. 1A is a system diagram illustrating a system for parsing user emails and extracting merchandise according to some embodiments of the disclosure.

FIG. 1A is a system diagram illustrating a system for parsing user emails and extracting merchandise according to some embodiments of the disclosure.

As illustrated in FIG. 1A, a system 100a includes a client device 102, a network 104, an application server 106, an authentication endpoint 108, a database of users 110, a mail server 112, a database of email messages 114, a mail queue 116 including a plurality of jobs 116a-n, an inbox processor including a plurality of agents 118a-n, a configuration database 120, third party data database 122, items database 124, and log database 126.

In the illustrated embodiment, a client device 102 issues requests to application server 106 via network 104. In some embodiments, client device 102 may comprise a desktop computer, laptop computer, tablet device, mobile phone, or other computing device. Various types of requests between client device 102 and application server 106 are discussed herein including login requests and wardrobe requests. Network 104 may comprise a network such as the Internet. In one embodiment, client device 102 can communicate with application server 106 via numerous protocols including, for example, HTTP. In some embodiments, application server 106 may comprise one or more web servers.

Application server 106 is communicatively coupled to authentication endpoint 108. In one embodiment, authentication endpoint 108 may comprise a service provider that stores user details in user database 110. For example, authentication endpoint 108 may comprise a web service (e.g., Gmail) with whom a user maintains a user account. Authentication endpoint 108 may provide an API allowing access to user account details with the proper user credentials. Authentication endpoint 108 may allow users to "sign in" to third party sites using a protocol such as OAuth.

Authentication endpoint 108 is connected to mail server 112 and may provide access to a user's mail in mail database 114 via a second, or the same, API. In one embodiment, authentication endpoint 108 and mail server 112 may be owned or operated by the same entity. In many embodiments authentication endpoint 108 and mail server 112 may be distributed across many servers.

Figure 2A:
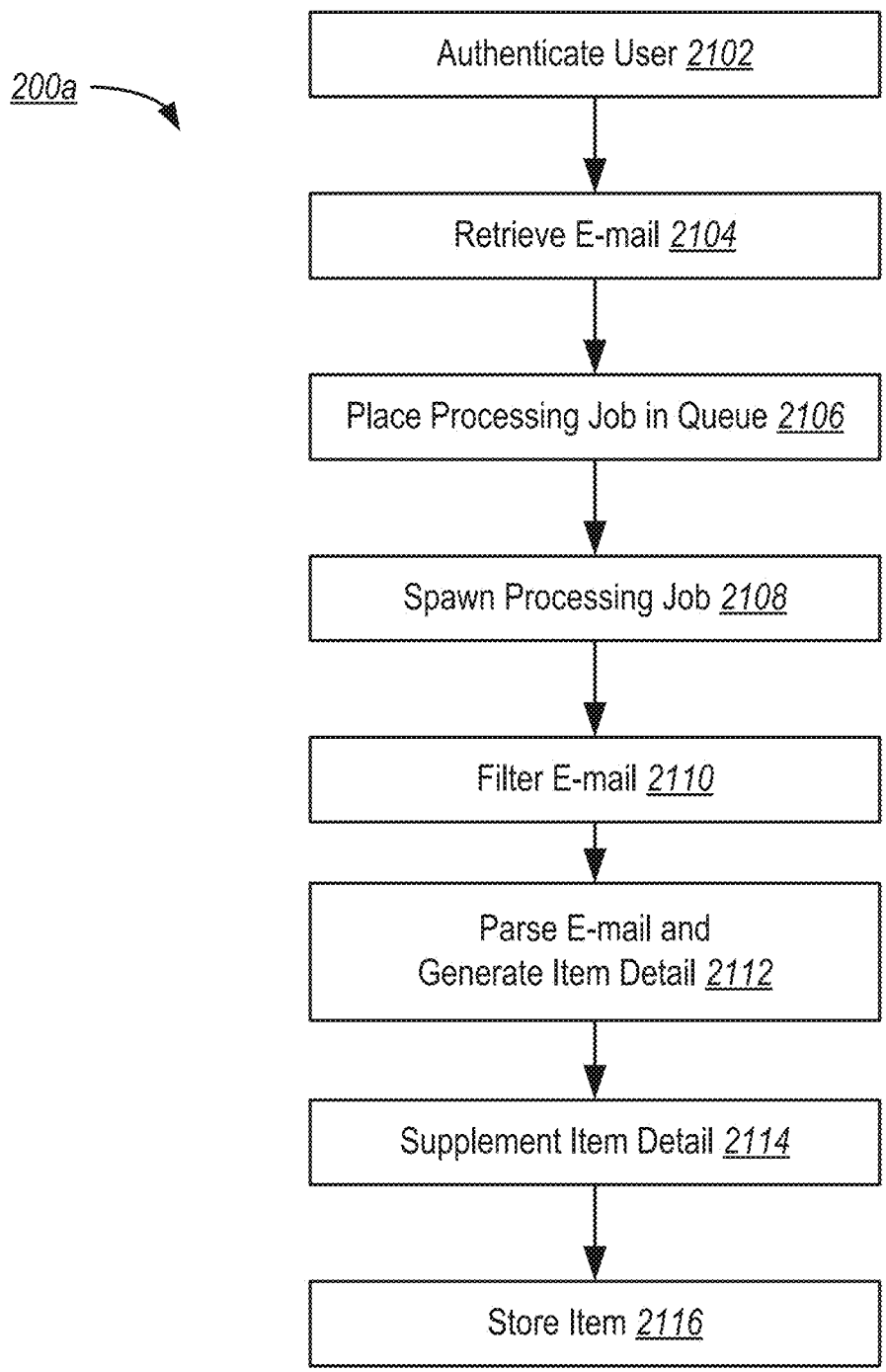
FIG. 2A is a flow diagram illustrating a method of extracting items of merchandise from a user email account according to some embodiments of the disclosure.
Figure 2B:
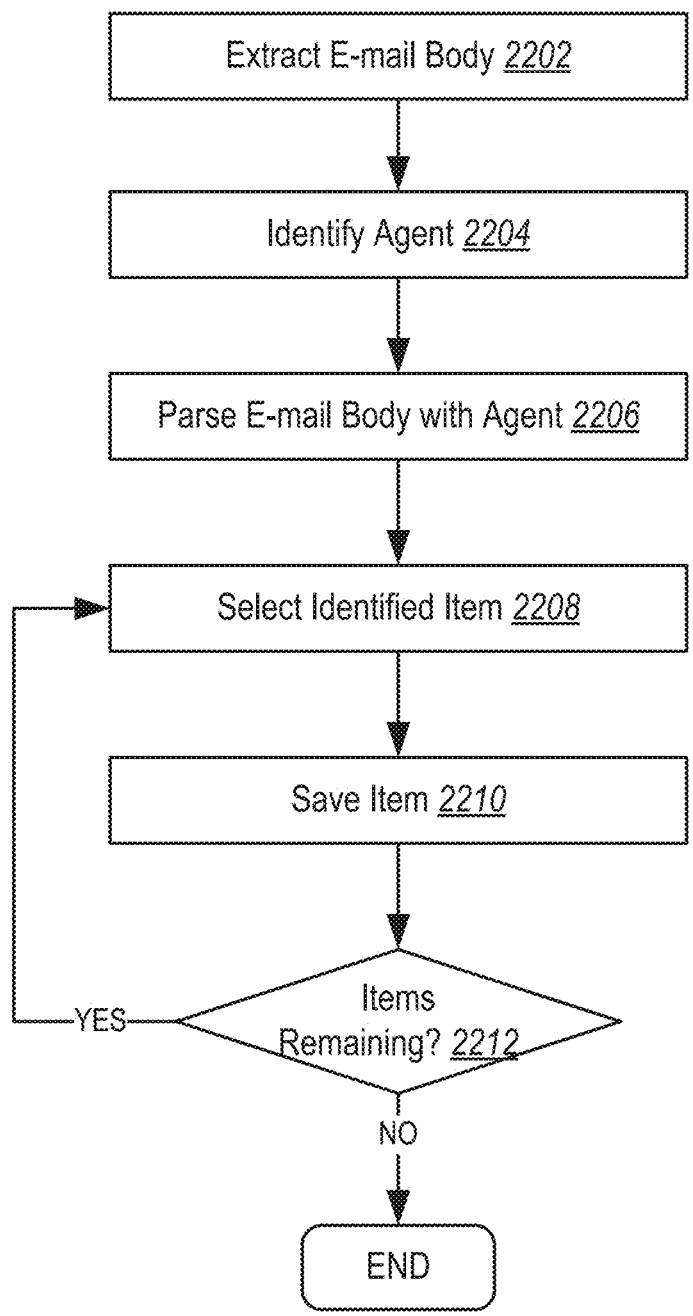
FIG. 2B is a flow diagram illustrating a method of parsing an email message to extract items of merchandise according to some embodiments of the disclosure.
Figure 2C:
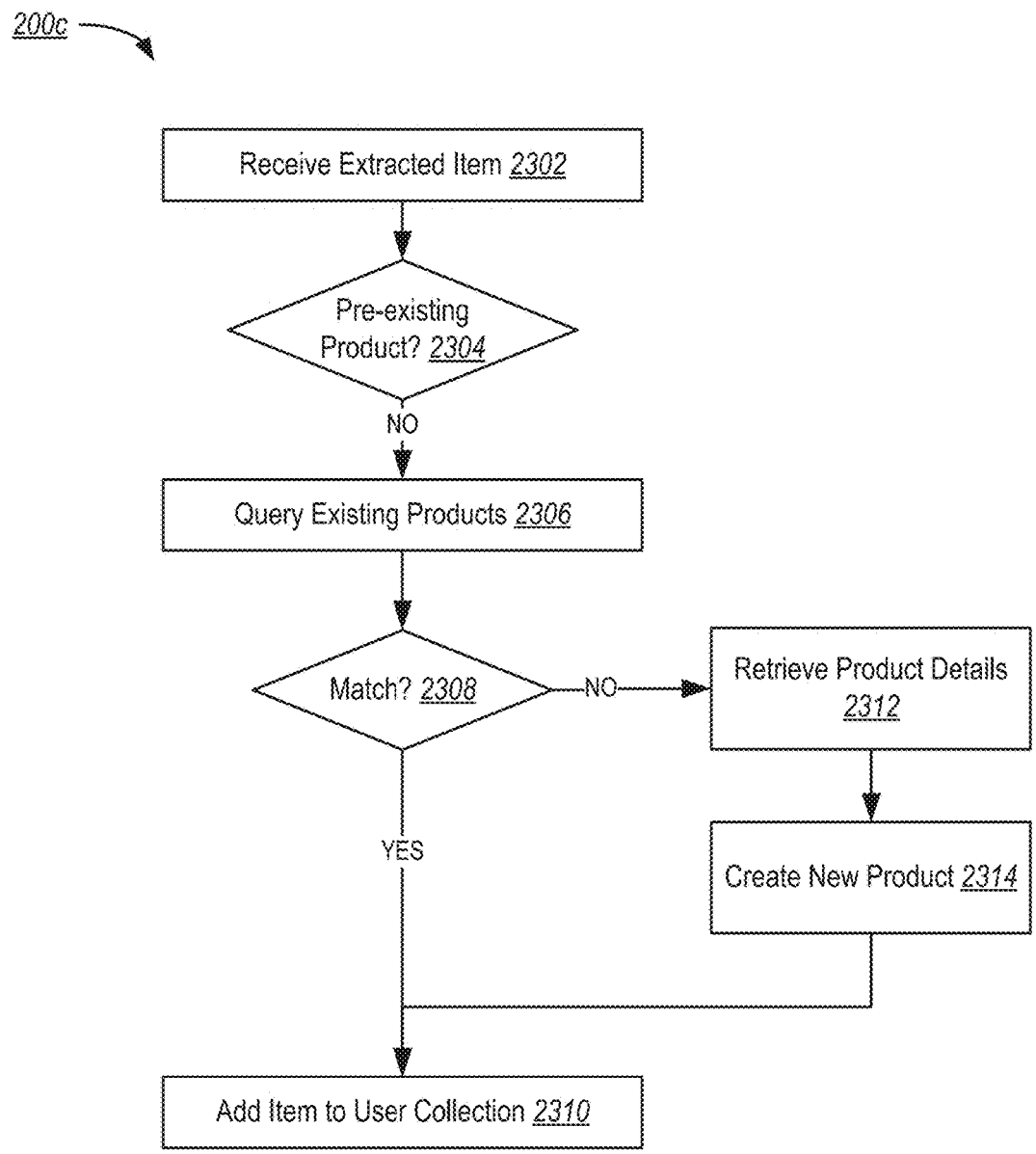
FIG. 2C is a flow diagram illustrating a method of augmenting and storing items of merchandise according to some embodiments of the disclosure.

Application server 106 may be configured to authenticate users and retrieve user emails as described more fully in connection with FIGS. 2A-C. Application server 106 may additionally be configured to place one or more jobs 116a-n into mail queue 116 for further processing as described more fully in connection with FIGS. 2A-C. In one embodiment, mail queue 116 may be connected to application server 106 via a network such as the Internet or an internal LAN and may comprise a dedicated or virtualized server device. In one embodiment, a job 116a-n may include one or more emails received from authentication endpoint 108 as well as user details (e.g., a token) retrieved during the authentication process. In alternative embodiments, a job 116a-n may only include user details.

Mail queue 116 may be configured to transmit jobs to inbox processor 118. In some embodiments, mail queue 116 may issue a single job at a time to inbox processor 118. Alternatively, mail queue 116 may transmit multiple jobs to inbox processor 118. In some embodiments, inbox processor 118 may comprise a server-less computing system. In one embodiment, jobs 116a-n sent to inbox processor 118 may comprise individual processes or threads running on a server system. In some embodiments, each job 116a-n running on inbox processor 118 may include its own dedicated physical or virtual resources (e.g., CPU, memory, etc.).

Inbox processor 118 may include one or more running agents 118a-n created using an agent configuration retrieved from configuration database 120. Each agent may be configured to process one or more emails stored within a job 116a-n that was sent to inbox processor 118 and extract items of merchandise, as described more fully herein. Alternatively, an agent 118a-n may be configured to retrieved email messages from mail server 112 via a user token included with the job 116a-n.

Additionally, each agent 118a-n may be configured to retrieve information regarding the extracted items from third party data 122. In one embodiment, third party data 122 may comprise a remote, third party-operated service that can provide details regarding items of merchandise via one or more APIs.

Agents 118a-n may additionally be configured to transmit item details to items collection 124. In one embodiment, items collection 124 may comprise a relational or NoSQL database. Although not illustrated, the system 100a may include various other databases as discussed herein. For example, the system 100a may include a products data for storing canonical products. Additionally, the system 100a includes a logs database that stores logs generated by agents 118a-n during processing.

Figure 1B:
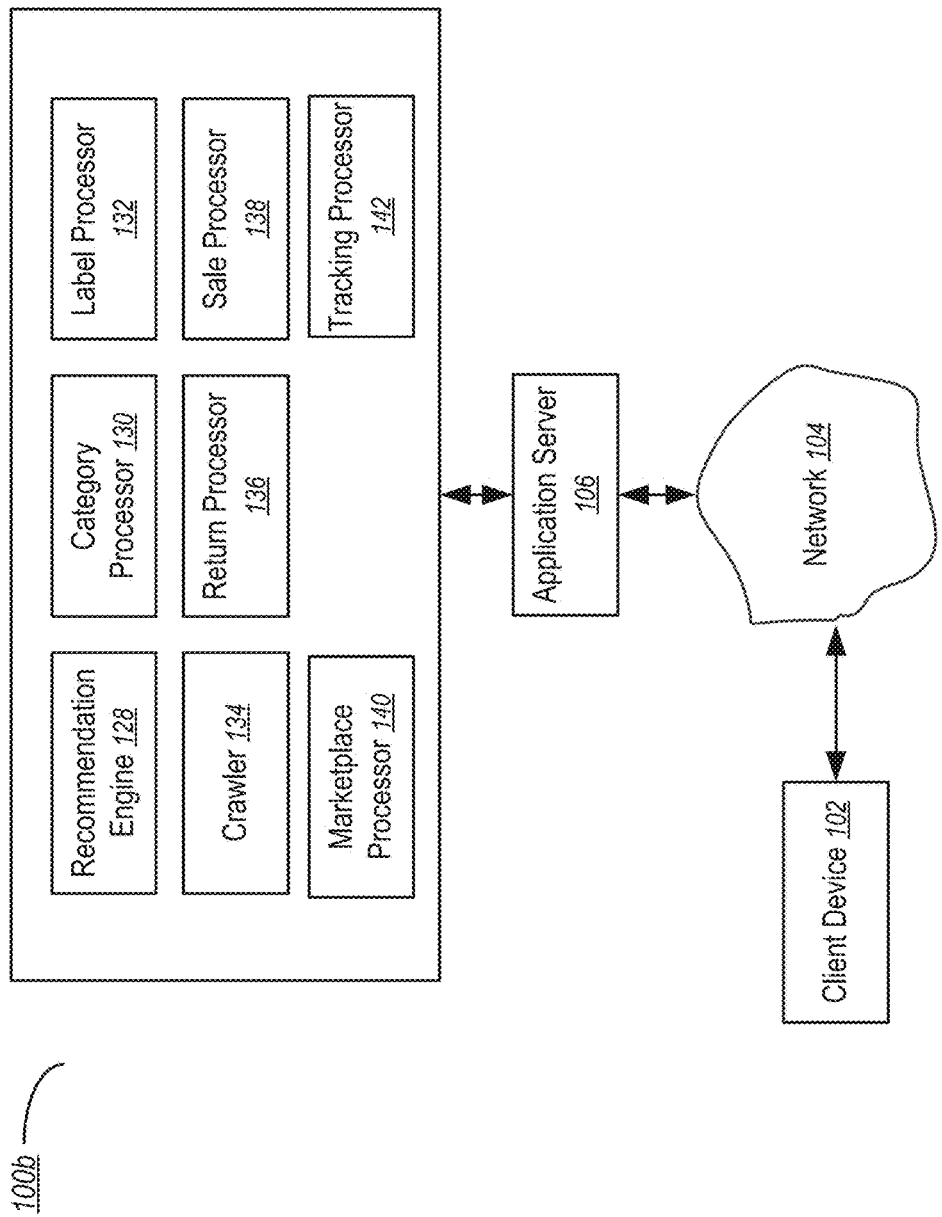
FIG. 1B is a system diagram illustrating a system for managing a user wardrobe according to some embodiments of the disclosure.

FIG. 1B is a system diagram illustrating a system for managing a user wardrobe according to some embodiments of the disclosure.

As illustrated in FIG. 1A, a system 100b includes a client device 102, a network 104, an application server 106, a recommendation engine 128, category processor 130, label processor 132, crawler 134, return processor 136, sale processor 138, marketplace processor 140, and tracking processor 142. As illustrated application server 106 may issues requests to various devices 128-142.

Recommendation engine 128 may comprise one or more application servers configured to receive a request for recommendations from a user via the application server 106. Recommendation engine 128 may perform the methods described in connection with FIGS. 3A through 3E and 12.

Category processor 130 may comprise one or more application servers configured categorize items received from the application server 106. Category processor 130 may perform the methods described in connection with FIG. 4.

Label processor 132 may comprise one or more application servers configured to receive a request for labelling from the application server 106. Label processor 132 may perform the methods described in connection with FIG. 5.

Crawler 134 may comprise one or more application servers configured to receive a request for product details from the application server 106. Crawler 134 may perform the methods described in connection with FIG. 6.

Return processor 136 may comprise one or more application servers configured to receive a request to identify return items from the application server 106. Return processor 136 may perform the methods described in connection with FIGS. 7A through 7B and 9.

Sale processor 138 may comprise one or more application servers configured to monitor items for sales and/or price adjustments. Sale processor 138 may perform the methods described in connection with FIGS. 8 and 10. Marketplace processor 140 may comprise one or more application servers configured to provide e-commerce functionality to application server 106. Marketplace processor 140 may perform the methods described in connection with FIGS. 13 and 15.

Tracking processor 142 may comprise one or more application servers configured to provide tracking updates to users via application server 106. Tracking processor 142 may perform the methods described in connection with FIG. 14.

Although the devices 128-142 are illustrated as singular devices, each device 128-142 may comprise multiple servers located in geographic distinct locations.

FIG. 2A is a flow diagram illustrating a method of extracting items of merchandise from a user email account according to some embodiments of the disclosure.

In step 2102, the method authenticates a user.

Authenticating a user may comprise executing an OAuth workflow with a remote provider of a user account. In some embodiments, a provider of a user account may comprise an email provider such as Google (Gmail), Yahoo! (Yahoo Mail), Verizon Communications (AOL Mail), or Microsoft (Outlook). Alternatively, the user account provider may comprise any provider providing email via protocols such as IMAP, POP, etc. In some embodiments, authentication of a user may be performed multiple times for multiple email addresses (e.g., from different or the same provider) owned or operated by a user. In some embodiments, other authentication schemes other than OAuth may be utilized to authenticate a user. In some embodiments, authenticating a user may comprise receiving an access token to access the user account at a later date.

In step 2104, the method retrieves email messages associated with the authenticated account.

In some embodiments, retrieving email messages may comprise requesting email messages from the email provider via an application programming interface ("API"). In some embodiments, the email provider may provide an API allowing third-party applications to retrieve email messages using one or more defined "endpoints." In this embodiment, the method transmits a request to an endpoint associated with an email account and may download all or some of the email messages associated with a user account.

In one embodiment, the method may retrieve all email messages. In alternative embodiments, the method may only retrieve messages based on a filter condition. For example, the method may only retrieve emails including certain pre-defined words in the title or from certain senders (e.g., email addresses or domains). In some embodiments, the method may limit the number of emails retrieve based on a date.

In alternative embodiments, the method may not download messages at step 2104 but may download messages as part of a processing job as discussed herein.

In step 2106, the method places a processing job in a processing queue.

In one embodiment, placing a processing job in a queue may comprise creating a new processing job and associating the processing job with the email retrieved in step 2104. Alternatively, or in conjunction with the foregoing, placing a processing job in a processing queue may comprise generating a job with user account information and a token for accessing the user's email account.

In step 2108, the method spawns a processing job.

In some embodiments, the method may periodically spawn processing jobs in response to available computing and/or storage resources. In alternative embodiments, the method may create new computing resources in order to spawn a processing job. In some embodiments, processing jobs may be run using a "server-less" architecture.

In alternative embodiments, step 2104 may be performed as part of step 2108. That is, a user's email messages may be downloaded as part of the processing job rather than prior to the processing job. In alternative embodiments, each processing job may only retrieve a portion of the user's email messages.

In step 2110, the method filters email messages.

In some embodiments, the method may filter the email messages by one or more filtering criteria to limit the total amount of email to be processed. For example, in one embodiment, the method may filter emails based on the identity of a sender or by keywords appearing in the subject line or body of the email. For example, the method may search the inbox for all emails with the subject containing: "Receipt," "purchase", "order" or "thank you" but not "Free", "off", or "coupon." In some embodiments, the method may filter the email message multiple times, while in other embodiments the method may perform a single filtering pass.

In some embodiments, a processing job may be monitored to improve the efficiency of the processing queue. For example, the method may determine whether a processing job can execute within a preset time period (e.g., 300 seconds). If so, the method may schedule a single processing job. Alternatively, if the existing job cannot execute within the preset time period, the method may segment the processing job into additional "sub-jobs." In one embodiment, the method may delegate sub-jobs to a processing queue. That is, the method may fork the processing job into multiple sub-jobs and place these sub-jobs back into a processing queue. In one embodiment, the method may immediately run the sub-jobs instead of placing the sub-jobs in the queue. In some embodiments, the forking of a sub-job comprises selecting a subset of a user's email messages and assigning the subset to a sub-job.

In step 2112, the method parses an email and generates item details based on the email.

In one embodiment, the method parses an email by first selecting an appropriate parser. In some embodiments, the selection of a parser may be based on the sender email address (or sender email address domain). Alternatively, or in conjunction with the foregoing, the parser may be selected based on the send date of the email due to retailers changing emails over time. In alternative embodiments, the method may use a single, generic parser to parse all email messages.

In some embodiments, a parser may be associated with a configuration file which specifies the parser details. In some embodiments, the configuration may be stored within a parser database. In one embodiment, the parser configuration may comprise an XSLT transformation that may be applied to an HTML email and generate an XML representation of the messages as described more fully herein. In alternative embodiments, the parser configuration may comprise a configuration file created using XPath (e.g., defined paths), plaintext, or JavaScript (e.g., retrieval functions). Notably, other technologies may be used provided that the selected technology converts HTML messages to structured item representations.

In some embodiments, the method may additionally be configured to parse plain-text e-mail message bodies in addition to HTML or other, formatted message bodies. In this embodiment, the method may utilize regular expressions or other comparisons to extract items.

In step 2114, the method supplements the extracted item detail with additional information.

In some embodiments, the method attempts to add additional detail from third party sources to the detail extracted from the email message. In one embodiment, the method may issues an HTTP request to an API of a web service that provides information for products or merchandise. For example, the method may transmit an item name, SKU number, or other identifier to the third party and may receive a structured representation (JSON, XML, etc.) of the product including images and other product details. In some embodiments, the method may require the retrieval of a category name or category number(s) from the third party. In some embodiments, the method may also identify a hexadecimal color associated with item by analyzing pixels of one or more pictures associated with the item.

In step 2116, the method stores the item.

In one embodiment, storing the item may comprise inserting the details of the item into a user wardrobe collection or table of a database. In some embodiments, the method may additionally check to ensure that the item is not a duplicate of a previously stored item. In some embodiments, the method may additionally store logs relating to the aforementioned processing steps.

In some embodiments, the method may additionally allow a user to view their wardrobe(s) of items and create outfits using items from the wardrobe. The method may additionally allow the user to save outfits. In some embodiments, the method allows the user to purchase items from merchants and/or add merchant items to a wishlist. In some embodiments, the method allows users to share items with friends, stylists, personal shoppers, etc., via email, SMS, or other means.

In some embodiments, the method may additionally add the item to a collection of products. In this embodiment, the method may use two collections: one for user items and one for all items. That is, a collection for items and a collection for items associated with users (and associated with the canonical items).

In some embodiments, the above method may be run once on all user emails when a user registers with a website or web application. Alternatively, or in conjunction with the foregoing, the method may be run periodically after user registration.

In some embodiments, the method may additionally support multiple "closets." In one embodiment, a closet corresponds to a defined projection of all or part of a user's wardrobe inventory. For example, a user may have a closet for work clothing, exercise clothing, certain event types, etc. In a first embodiment, the method may simply place all extracted items into a single, default closet.

Alternatively, or in conjunction with the foregoing, the method may also automatically sort items into additional closets. In one embodiment, the method may ask the user if he or she wishes to create a new closet. If so, the method receives a type for the closet (e.g., child, baby, partner, etc.). Upon receiving a type the method may scan the extracted items and identify those items matching the closet type. For example, the method may identify categories that are related to the closet type.

The method may then present the new closet with items to the user for review and approval, denial, or modification. Finally, the method may create the closet and add the approved items to the closet.

In some embodiments, the method may additionally allow the user to define rules for placing items in separate closets. In one embodiment, the rules may be based on assigning a sender email address to the closet. In alternative embodiments, the rules may be based on keywords present within the email message or subject line. In alternative embodiments, the rules may be based on identifying a particular store. In alternative embodiments, the rules may be based on the size of the items (e.g., children versus adults). In some embodiments, the rules may be based on detecting a forwarded email including the closet name in the subject line. In some embodiments, machine learning may be utilized to refine rules based on the manual sorting operations performed by the user. That is, since items are associated with email messages, the method may detect a manual user operation and inspect the email message to determine if a rule should be created or modified based on the content of the email message.

FIG. 2B is a flow diagram illustrating a method of parsing an email message to extract items of merchandise according to some embodiments of the disclosure.

In step 2202, the method extracts an email body. As discussed previously, the method may receive an email message including metadata and content. In one embodiment, the method first extracts the body from the message (e.g., an HTML portion of the email messages).

In step 2204, the method identifies the appropriate agent. In some embodiments, multiple agents may be associated with individual merchants. In alternative embodiments, agents may be assigned to specifically formatted email messages. For example, a first agent may be assigned to a first email (e.g., a receipt) sent by a merchant whereas a second agent may be assigned to a second email (e.g., a shipment notice) sent by a merchant. In some embodiments, an agent may include or comprise a parser as described previously.

In step 2206, the method parses the email body with the identified agent.

In one embodiment, the method may utilize an XSLT transform to convert the HTML body of the email to a structured format (e.g., XML). As known in the art, XSLT is a technology designed to, among other things, convert structured documents of one form to another. In the process, XSLT transforms allow for the selection and exclusion of elements of the original document.

In some embodiments, an XSLT transform may be created for each email template or each merchant. In some embodiments, the XSLT transform may include instructions identifying where the details of an item appear within an email body and instructions for extracting and processing these items. In some embodiments, the XSLT file may utilize attributes of the HTML element in the email body, or may utilize the hierarchal structure of the email body to extract item details. In some embodiments, the XSLT transform may include hardcoded values to be used in the output document. For example, the XSLT transform may include a hardcoded store name or store identifier.

In some embodiments, XSLT transforms may be stored by a server on disk (e.g., as XML files). Alternatively, XSLT transforms may be stored within a database. In some embodiments, a database may include a key-value storage (or similar arrangement) to associate item fields (e.g., name, SKU, brand, product URL, product image(s), price, size, order number, order date, etc.) with selectors (e.g., the value of the "select" attribute of the "xsl:value-of" element). Additionally, the database may store other fields needed to generate a complete XSLT transform. In some embodiments, the method may be configured to automatically build the XSLT based on the values stored in the database. For example, the method may first query for a first selector indicating how to find products (e.g., using an "xsl:for-each" element) and then query for each of the individual field selectors. The method may then combine these into an XSLT transform.

In alternative embodiments, parsing an email may comprise using JavaScript to extract portions of the email using DOM parsing techniques. For example, the agent may utilize one or more function calls that utilize methods to retrieve elements of the HTML email and extract the inner HTML or inner text of the HTML elements.

In alternative embodiments, the parsing an email may comprise evaluating a plurality of XPath expressions to identify elements within the HTML body and extract the inner HTML or inner text of the HTML elements. In alternative embodiments, the agent may utilize regular expressions to identify item details.

In step 2208 selects a parsed item and, in step 2210, saves the item. In one embodiment, saving the item may comprise inserting the details of the item into a user wardrobe collection or table of a database. In some embodiments, the method may additionally check to ensure that the item is not a duplicate of a previously stored item. In some embodiments, the method may additionally store logs relating to the aforementioned processing steps.

In step 2212, the method determines if any items are remaining and if so repeats steps 2208 and 2210 for the remaining items.

FIG. 2C is a flow diagram illustrating a method of augmenting and storing items of merchandise according to some embodiments of the disclosure.

In step 2302, the method receives an extracted item. In the illustrated embodiment, the extracted item may comprise an item extracted from an email message as described in FIGS. 2A and 2B, the disclosure of which is incorporated herein by reference in its entirety.

In step 2304, the method determines if a pre-existing product has already been added to a canonical collection of products.

In some embodiments, if the method determines that a pre-existing product has already been added to a canonical collection of products, the method may simply associate the extracted item with the existing products. Thus, the method in this case would not have to perform steps 2306, 2308, 2312, and 2314. In some embodiments, the method may utilize an identifier of a product associated with an item to determine if the product is pre-existing.

In step 2306, the method queries for existing products. The method reaches step 2306 upon determining that the item includes a product that has not been previously processed by the method. In this case, the method may transmit an HTTP request to a third party source of product information.

In step 2308, the method determines if the third party has any products matching the item. In some embodiments, the third party may not include any details regarding the product included in the item. In this case, the method would continue to add the item to the user collection, but would bypass the creation of a new, canonical product.

In step 2312, in contrast, the method retrieves product details associated with the item if the third party identifies a product that matches the item. As discussed previously, product details may include details such as a name, SKU, brand, product URL, product image(s), price, and/or size associated with the product. In some embodiments, the method may receive the product details during the querying step (2306). In alternative embodiments, the method may separately retrieve the product details by issuing a second request.

In step 2314, the method creates a new product using the product details. In some embodiments, the method may add the item to a collection of products. In this embodiment, the method may use two collections: one for user items and one for all items. That is, a collection for items and a collection for items associated with users (and associated with the canonical items). Thus, in step 2314, the method first saves the product to a products collection in order to track individual products (regardless of their association with particular users).

In step 2310, the method adds the item to a user collection. In one embodiment, adding an item to a user collection may comprise inserting the details of the item into a user wardrobe collection or table of a database. In some embodiments, the method may additionally check to ensure that the item is not a duplicate of a previously stored item. In some embodiments, the method may additionally store logs relating to the aforementioned processing steps.

Figure 3A:
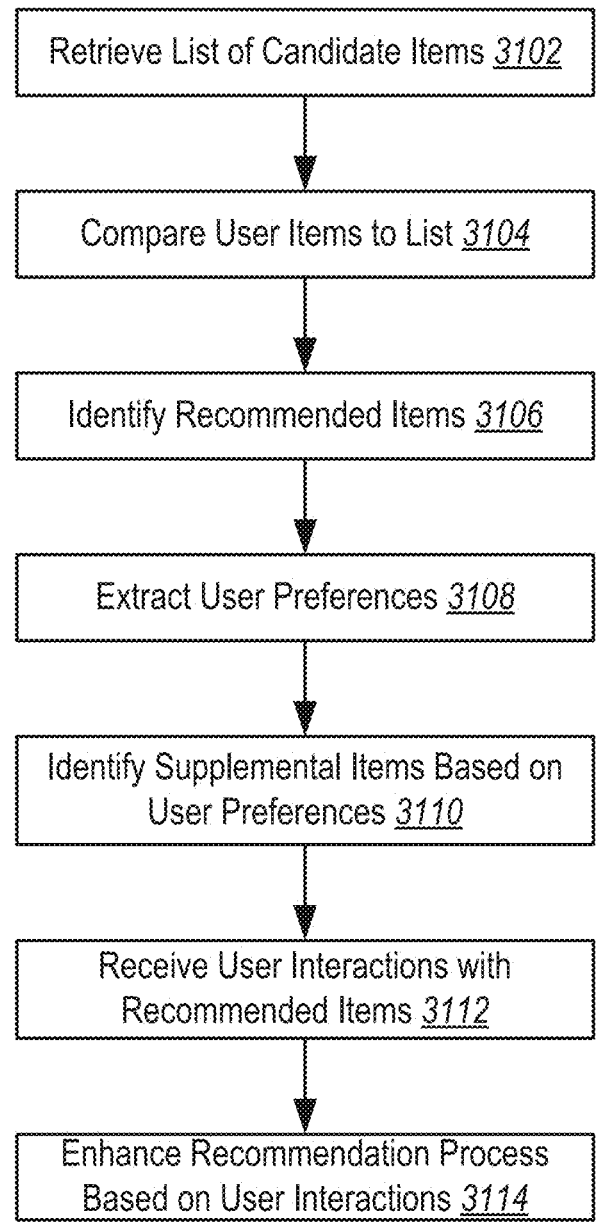
FIG. 3A is a flow diagram illustrating a method of recommending items of merchandise based on a collection of user merchandise according to some embodiments of the disclosure.

FIG. 3A is a flow diagram illustrating a method of recommending items of merchandise based on a collection of user merchandise according to some embodiments of the disclosure.

In step 3102, the method retrieves a list of candidate items. In one embodiment, the candidate items may comprise a listing of items the user does not have in his or her wardrobe. In some embodiments, the candidate list may be generated based on popular items detected by the method (e.g., via scraping other user accounts, via popular shopping websites, etc.). Alternatively, or in conjunction with the foregoing, the candidate items may be items on a user's wishlist or similar to items a user owns.

In step 3104, the method compares a user's items to the list of candidate items. In some embodiments, the method may additionally filter a user's items to only identify a subset of the items. For example, the candidate items may be associated with a theme (e.g., "summer clothing" or "handbags"). In this embodiment, the method may limit the user's items selected to those matching the same theme as the candidate items.

In step 3106, the method identifies one or more recommended items. In one embodiment, the method compares a listing of user items to the recommended items and identifies items in the recommended items that are not already identified in the list of user items. In this manner, the method can identify items that may be of interest to the user and are also popular (as indicated by their inclusion in the candidate list).

In step 3108, the method extracts a user's preferences. In one embodiment, the method may utilize item preferences saved by the user. For example, a user may save preferences related to the color, style, brand, or other attribute of a piece of merchandise such as clothing.

In step 3110, the method identifies supplemental items based on the user's preferences.

In one embodiment, the method may supplement the candidate items based on items related to the user's preferences. For example, the method may identify a favorite brand of the user and identify other brands that are currently popular with similar users. In this manner, the method may utilize a second listing of popular attributes (e.g., brands, colors, styles, item types etc.) and compare the list to the user's preferences.

In alternative embodiments, the method may additionally supplement the list of candidate items with items from other users' wardrobes. For example, the method may select a user having a similar wardrobe to the selected user (or having a similar wardrobe to the candidate items) and may use the other user's wardrobe to generate a list of candidate items. Next, the method may identify those items in the other user's wardrobe that do not appear in the selected user's wardrobe and may identify the missing items as recommended items.

In step 3112, the method receives user interactions with the recommended items.

In one embodiment, the method displays user items to a user for review. In one embodiment, the method may display a grid, list, or other representation of the items. In one embodiment, the display may comprise a website or mobile application. In some embodiments, the display may additionally provide links for purchasing or viewing more detail regarding the items. In some embodiments, a user may interact with a listing of recommended items in a variety of ways. For example, the user may click a hyperlink associated with a recommended item, purchase an item, "favorite" or "save" an item, "discard" an item, or otherwise indicate a preference (positive or negative) for one of the recommended items.

In step 3114, the method enhances the recommendation process (described previously) based on the user interactions.

In one embodiment, the method may monitor the aforementioned user interactions with the recommended items. For example, the method may monitor a user's mouse, hover, or touch activity with a displayed item to determine the level of interest in an item. By monitoring a user's interactions the method may modify the selection process of recommended items in order to refine the recommendations in future applications of the method.

Figure 3B:
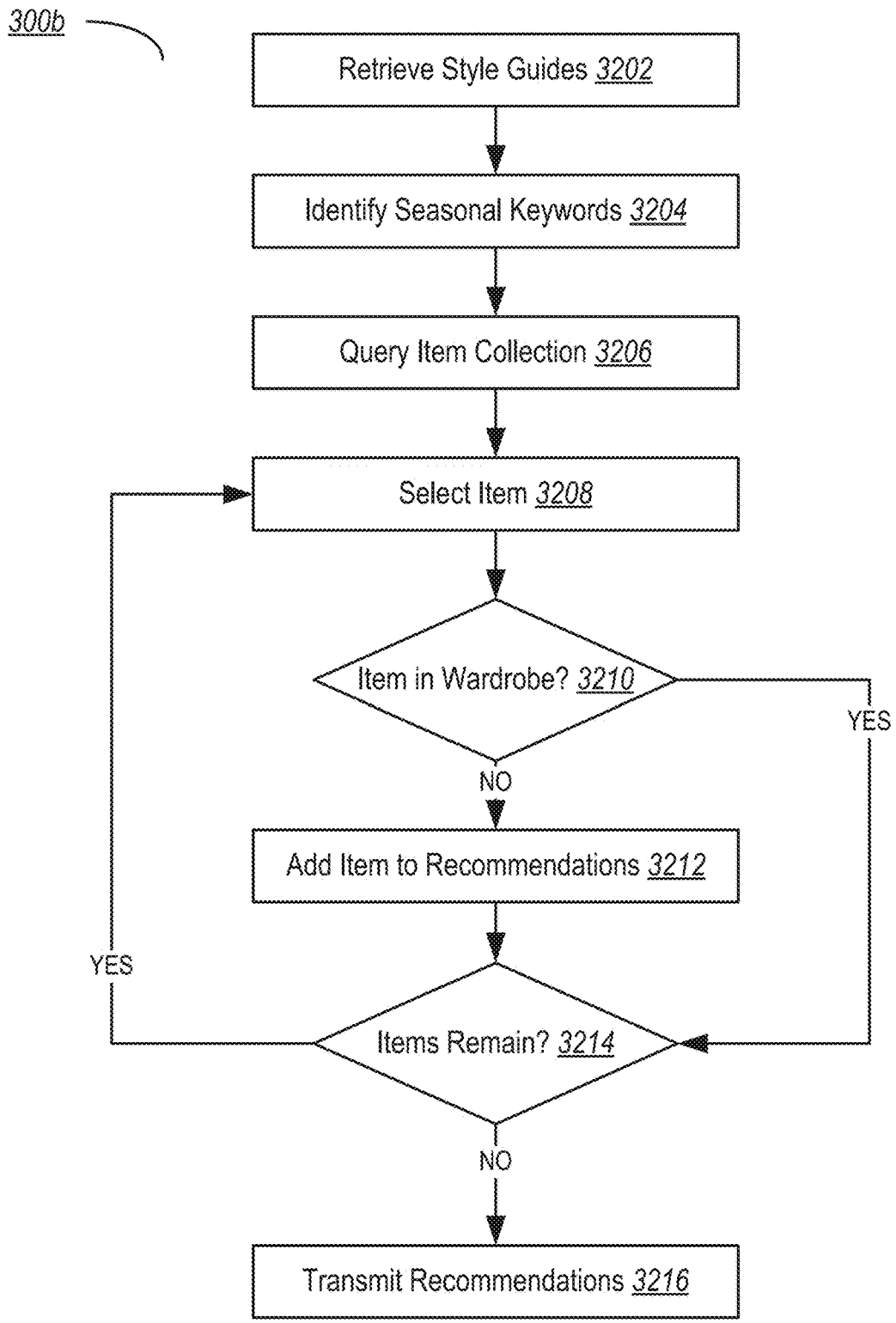
FIG. 3B is a flow diagram illustrating a method of recommending items of merchandise based on a style guide according to some embodiments of the disclosure.

FIG. 3B is a flow diagram illustrating a method of recommending items of merchandise based on a style guide according to some embodiments of the disclosure.

In step 3202, the method retrieves style guides. In one embodiment, a style guide may comprise a structured listing of products published or otherwise provided by a merchant such as brand, retailer, manufacturer, or other entity responsible for making or selling products. In some embodiments, the style guide may include a listing of items including identifiers such as SKU numbers.

In step 3204, the method identifies seasonal keywords. In some embodiments, the method may perform a search on the style guides to identify keywords indicative of a trend. In some embodiments, the method may use various techniques (e.g., TF-IDF, or other NLP techniques) to identify "important" terms within style guides. By performing this search the method can extract one or more keywords that are "seasonally" important. That is, relevant at the date of the style guides. In some embodiments, the method may additionally adjust the lists based on a style type.

In step 3206, the method queries an item collection using the seasonal keywords. In one embodiment, querying an item collection may comprise selecting those items containing fields that include one or more of the seasonal keywords. In some embodiments, the method may additionally identify similar keywords to use based on the seasonal keywords. For example, the seasonal keywords may include the terms "winter," "scarf," and "gloves." In response, the method may supplement these keywords with similar keywords such as "snow" and "cold." In some embodiments, this supplementing may be undertaken based on the accuracy of past predictions. That is, the method may monitor users' interactions with recommendations and determine how accurate the supplemental keyword is as compared to the seasonal keyword. While described as natural seasons, seasonal keywords are not intended to be limited as such and generally refer to time-delimited keywords (e.g., a trending fashion style etc.)

In step 3208, the method selects an item returned from the query and performs steps 3210 and 3212 for each item returned from the query.

In step 3210, the method determines if the item is already in the user's wardrobe. If so, the method skips the item in order to prevent the recommendation of items the user owns.

In step 3212, the method adds the item to a list of recommendations if the item is not in the user's wardrobe.

In step 3214, the method determines if any items return from the query exist.

In step 3216, the method transmits the recommendations to a user. In some embodiments, the items may be displayed on a virtual "model" or may be presented as a list with images. In response, the user may select or reject items. If the user rejects all items the method may perform the method to provide an updated list of recommendations.

Figure 3C:
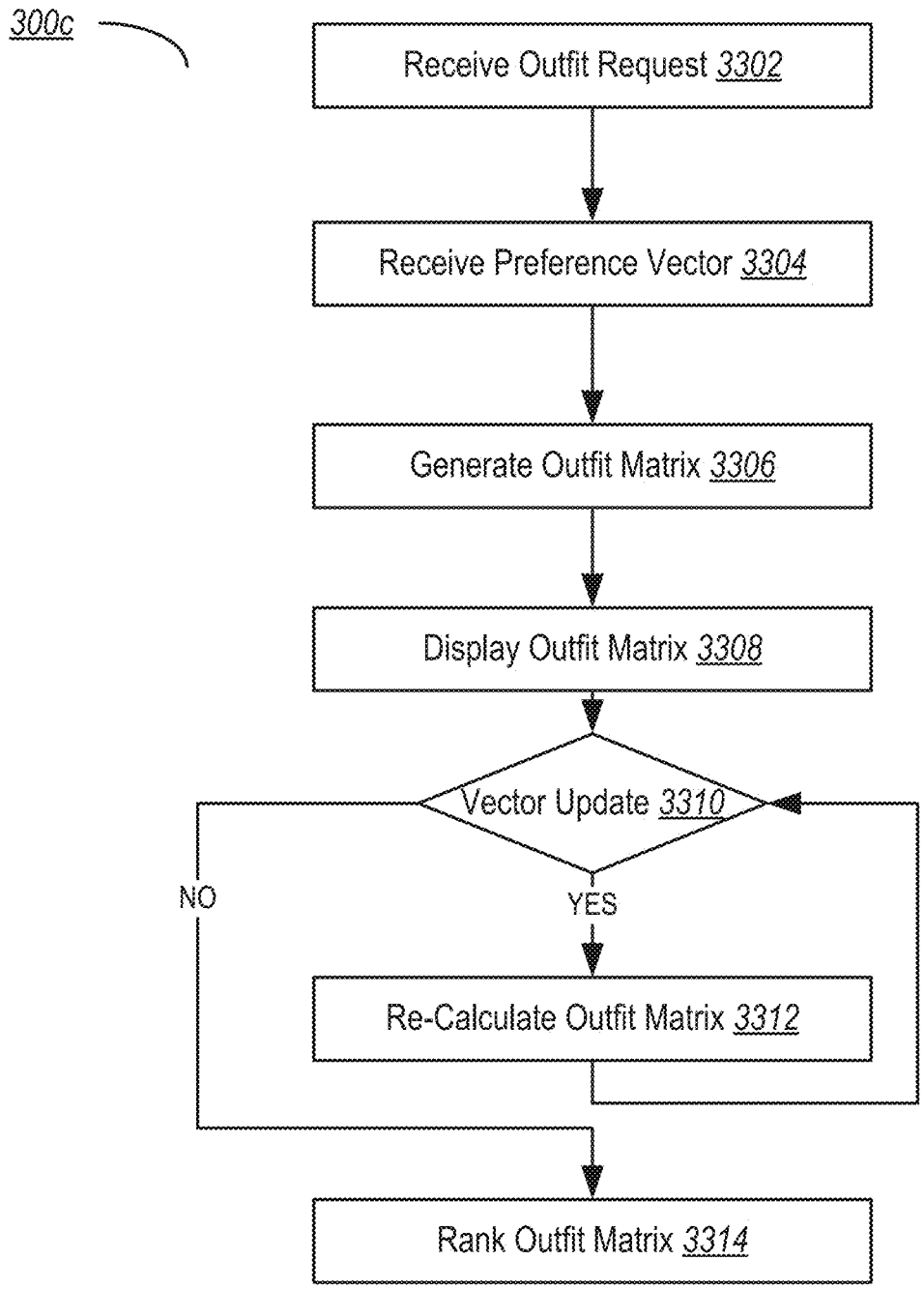
FIG. 3C is a flow diagram illustrating a method of generating outfits according to some embodiments of the disclosure.

FIG. 3C is a flow diagram illustrating a method of generating outfits according to some embodiments of the disclosure.

In step 3302, the method receives an outfit request. In one embodiment, an outfit request may comprise an HTTP request indicating the user wishes to create a wardrobe. For example, the request may comprise a request for a web application located at a particular URL.

In step 3304, the method receives a preference vector.

In some embodiments, the method may present the user with a list of options wherein the user may select one or more multiple values for each option. In some embodiments, the options may relate to preferred colors, categories, usages, etc. The user may select values and these values may be stored as an initial preference vector. For example, an initial preference vector may indicate that a user is looking for the colors black or dark blue, under the category of business casual, and to be used for a work meeting.

In step 3306, the method generates an outfit matrix.

In one embodiment, the outfit matrix may comprise a grid or cube of items. In one embodiment, a grid may be used to display items for various categories. In alternative embodiments, a cube maybe used to show single grids for each category and allowing the user to move between different grids. The actual display of items may always appear two-dimensional.

In one embodiment, the method identifies one or more categories of item types for each grid. Next, the method uses the preference vector to identify items in that type category. For example, the method may first select "Pants" and use the preference vector to narrow the options in that category for the user. In some embodiments, the method may extrapolate the preference vector to include similar items. For example, continuing the previous example, the method may include "dark gray" in the list of colors.

In step 3308, the method displays the outfit matrix. In one embodiment, displaying the outfit matrix may comprise transmitting the matrix to a user device (e.g., computer or mobile device). In some embodiments, transmitting the matrix may comprise transmitting a structured representation of the matrix (e.g., a JSON or XML file) and updating the display of a webpage or mobile application in response.

In step 3310, the method determines whether the user has updated the preference vector. In some embodiments, the user may update the preference vector after receiving an initial set of recommendations. For example, the user may update his or her color selections in response to viewing the recommendations.

In step 3312, the method may recalculate the outfit matrix upon detecting an update to the preference vector. In some embodiments, recalculating the outfit matrix may comprise transmitting the updated preference vector a server and generating a new outfit matrix as described in connection with step 3306. In some embodiments, the method may continue the aforementioned process until the user indicates otherwise. In some embodiments, the user may stop the process by selecting enough items to formulate an outfit. Alternatively, the user may proactively stop the process at any time.

In step 3314, the method may receive a ranking of the outfit from the user. In some embodiments, the method may update the method based on the received ranking. For example, the method may improve the search criteria generated from a preference vector based on whether the user provides the outfit suggestions with a positive or negative review.

Figure 3D:
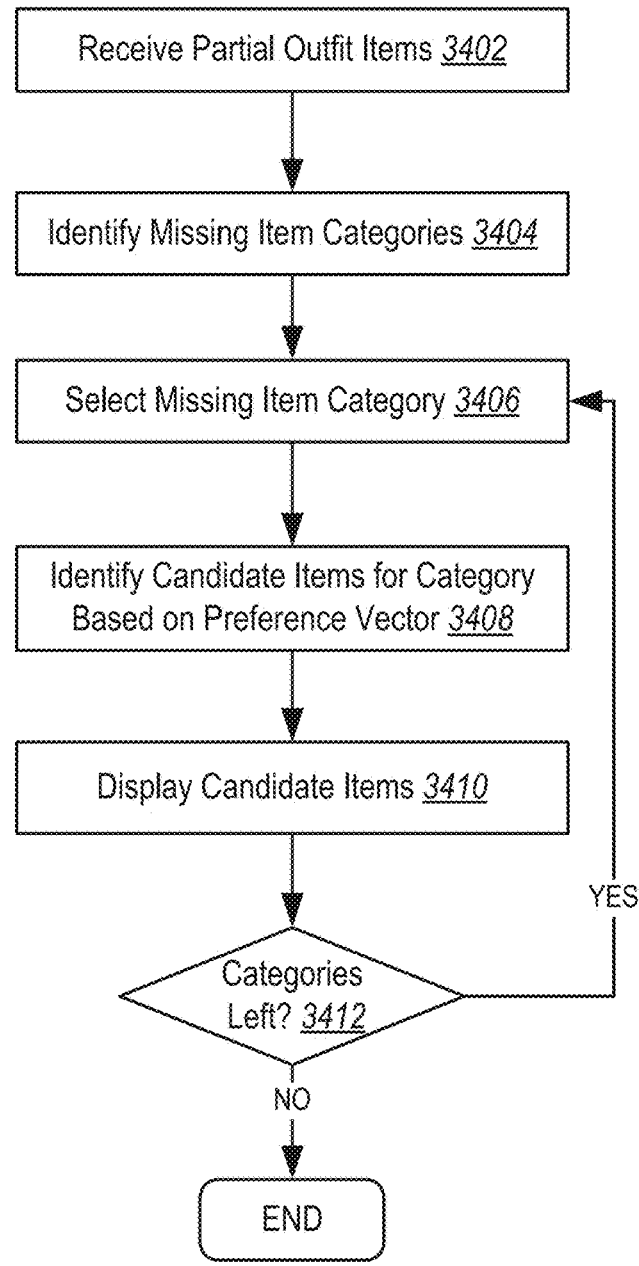
FIG. 3D is a flow diagram illustrating a method of completing an outfit according to some embodiments of the disclosure.

FIG. 3D is a flow diagram illustrating a method of completing an outfit according to some embodiments of the disclosure.

In step 3402, the method receives partial item outfits. In some embodiments, the method may allow a user to begin the process of building an outfit from items in the user's wardrobe and may allow the user to initial the method after identifying a portion of the required outfit items (e.g., selecting a pair of pants and hat but not selecting a shirt).

In step 3404, the method identifies the missing categories of items required for the outfit.

As illustrated, the method repeats steps 3408 and 3410 (discussed herein) for each of the remaining categories, steps 3406 and 3412.

As part of selecting items for an outfit, the method identifies a set of candidate items for a category based on a preference vector associated with the user and the categories, step 3408.

In some embodiments, the preference vector may be built based on analyzing a user's preferences for brands, colors, and other item attributes for a specific category. For example, if a user only purchases dark clothing, the preference vector may include only dark colors for the category of "Shirts." In some embodiments, the method may identify items from the user's wardrobe. Alternatively, or in conjunction with the foregoing, the method may identify items from a canonical, global item database or from third party merchants.

In step 3410, the method displays the items for a given category to a user. In some embodiments, the items may be displayed on a virtual "model" or may be presented as a list with images. In response, the user may select or reject items. If the user rejects all items the method may identify another set of candidate items and re-display the items.

Figure 3E:
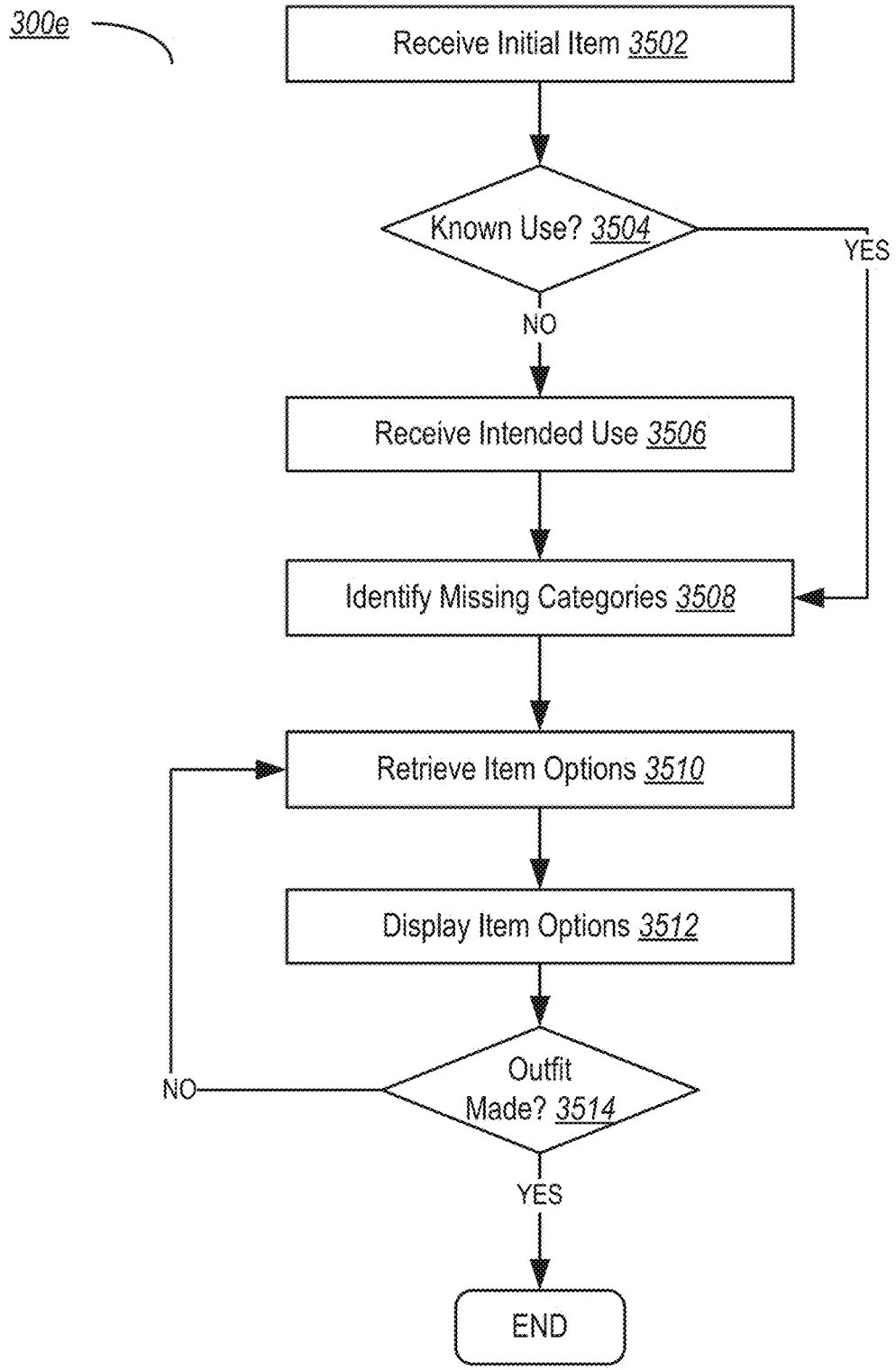
FIG. 3E is a flow diagram illustrating a method of generating an outfit according to some embodiments of the disclosure.

FIG. 3E is a flow diagram illustrating a method of generating an outfit according to some embodiments of the disclosure.

In step 3502, the method receives an initial item. In some embodiments, the initial item may comprise an item selected by a user from a user wardrobe.

In step 3504, the method determines if a known use exists for the item. In some embodiments, certain items or categories or items may be associated with a known use or activity. For example, sunglasses may be associated with the activity of "going to the beach."

In step 3506, the method receives an intended use from the user if a known use cannot be found. In some embodiments, a known use may not be apparent from the item or a known use may not be reliable. For example, a pair of jeans may not have an obvious intended use, but a user may know the actual use. Thus, in step 3506 the user may supply the known use based on his or her needs. In alternative embodiments, the method may allow the user to change the known use detected in step 3504.

In step 3508, the method identifies missing categories associated with the use, if any.

In some embodiments, a known or intended use may be associated with a number of categories. Continuing the previous example, the use of "going to the beach" may associated with the categories of "Sunglasses" and "Bathing Suits." Thus, the method may identify the category of "Bathing Suits" as a missing category if the initial item was a pair of sunglasses.

In step 3510, the method retrieves a plurality of item options for the missing categories.

In one embodiment, retrieving item options may comprise querying a canonical item database based on the missing categories. Alternatively, retrieving item options may comprise identifying options within a user's wardrobe. Alternatively, or in conjunction with the foregoing, the method may filter the returned items based on user preferences.

In step 3512, the method displays the item options.

In one embodiment, the method may display the options on a virtual "model" to preview the combined items or outfit. In alternative embodiments, the method may display the options in a grid or other display.

In step 3514, the method determines if an outfit has been made.

In some embodiments, the method may allow a user to accept or reject item options. If, after displaying a first set of options, the method determines that a complete outfit has not been made, the method may continue to load options until a complete outfit has been completed and all identified categories have an associated item option. In this manner, the method continues until the user receives a completed recommended outfit or prematurely terminates the process.

Figure 4:
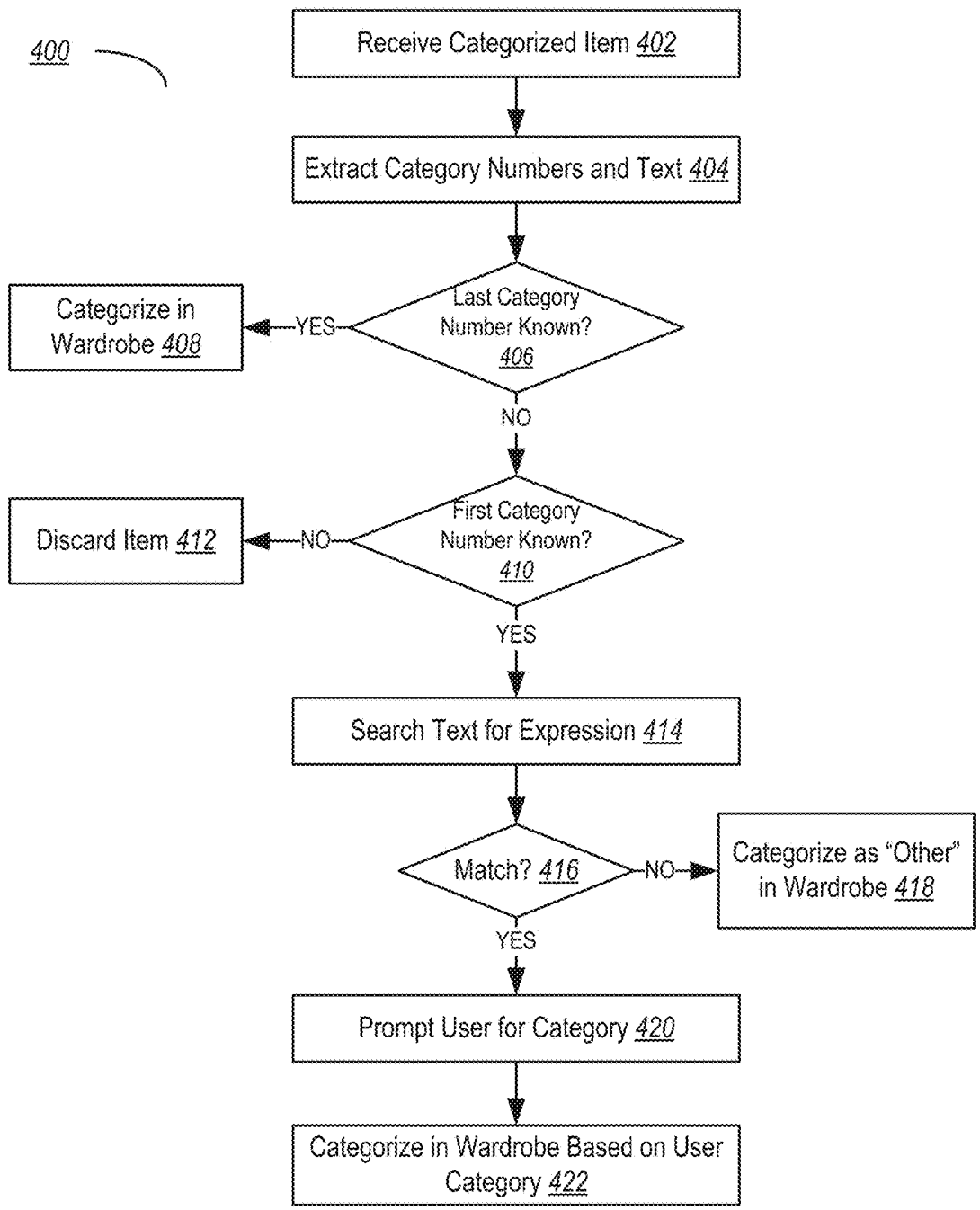
FIG. 4 is a flow diagram illustrating a method of categorizing an extracted item of merchandise according to some embodiments of the disclosure.

FIG. 4 is a flow diagram illustrating a method of categorizing an extracted item of merchandise according to some embodiments of the disclosure.

In step 402, the method receives a categorized item and, in step 404, extracts category numbers and category text from the item.

In the illustrated embodiment, the method may receive an item of merchandise after extracting the item of merchandise from a user email account as discussed previously. In this embodiment, the item of merchandise may be categorized according to a first schema. In one embodiment, the first schema may comprise a categorization according to a third-party categorization scheme. In the illustrated embodiment, an item of merchandise may be categorized with a name (e.g., "Women's Blouses") and with one or more numerical codes organized as a list or array of codes.

In step 406, the method determines whether the last extracted category number matches a known category number.

In one embodiment, the category numbers may be ordered in a particular manner. In one embodiment, the numbers may be organized according to a level of granularity. For example, the numbers "100, 200, 300" may correspond to "Women's Clothing," "Tops," and "Blazers," respectively. In this step, the method determines whether the wardrobe categorization scheme includes a category corresponding to the last category (e.g., "300" or "Blazers"). The method may perform this comparison to quickly categorize an item when a specific category already exists. Scenarios where a last number is known may include those items that include a single category ("Miscellaneous") or include a commonly used category (e.g., "Women's Shoes" appearing after "Shoes").

In step 408, if the last extracted category number matches a known category number the method categorizes the items in a wardrobe.

In the illustrated embodiment, a wardrobe may include its own categorization scheme. In one embodiment, the wardrobe's categorization scheme may be provided by a system storing the wardrobe. In alternative embodiments, the wardrobe categorization scheme may be configured by the user and be unique for each user's wardrobe or within separate wardrobes of a single user. For example, a male user may be assigned a first categorization scheme whereas a female user may be assigned as second categorization scheme. Users may additionally be allowed to modify pre-defined categorization schemes as desired.

In step 410, the method determines if the first extracted category number matches a known category number.

As illustrated, if the last number of the category numbers does not match a known category the method determines if the first category number matches a known category. As discussed previously, an existing category system may utilize a generic category number (e.g., one associated with "Women's Clothing" as the first number). In this case, as in step 406, the method isolates this scenario to quickly categorize an item as there are, in theory, only a limited number of top level category numbers.

In step 412, the method discards an item if the first extracted category number is not known.

In some scenarios, the method may encounter a new category in the first or last positions of the array of category numbers. In this scenario, the method may discard the item since the category is not supported by the system. Additionally, the method may not add the item to a user's wardrobe. In some embodiments, during the processing of email messages the methods described previously may identify non-wardrobe items. For example, a user may purchase clothing as well as non-clothing items from a large online retailer which may place both the items in a single email. In this example, the method ignores items that do not fall into a known highest level category. Alternatively, the method may store the items and, instead, "hide" the items from the user.

In step 414, the method searches the category text for a known expression if the first category number matches a known category number and, in step 417, determines if the category text matches the expression.

As an example, the method may analyze the category name to determine whether the category name matches a predefined expression such as "/women'?s?/i:" In this example, the method may be tuned to process, predominately, women's clothing and thus the detection of the category names including the term "women" or "women's." In this manner, the method may further refine the items into two sets: one meeting the set criteria and a set not meeting the set criteria.

In alternative embodiments, the method may utilize a set of pre-defined keywords mapped to one or more categories. In some embodiments, the mapping may additionally include excluding non-clothing items (referred to as "exclusion keywords"). In some embodiments, the method may utilize two levels of exclusion keywords.

In a first level, keywords that sometimes appear in real clothing items but also appear in non-clothing items (e.g., the term "bucket" which may refer to, for example, an "ice bucket" or a "leather bucket bag"). For this level, the method may determine if a category keyword (e.g., "bag") comes after a first level exclusion keyword (e.g., "bucket"). If there is a category keyword after the exclusion keyword, the method may place the item in the category and, subsequently, into a user's closet. If the exclusion keyword is last (e.g., in the phrase "bag of ice bucket") then the method may exclude the item.

At a second level, exclusions may include words like "Ziploc" or "ice bucket" which the method may always exclude regardless of other terms in the item description. As an example, the phrase "Ziploc bag" may be excluded even though it includes the word "bag."

In step 418, the method categorizes the item as "Other" if a match is not found in step 416.

As discussed above, the method may place all items not matching the expression in an "Other" category. For example, if the method (in steps 414 and 416) was configured to detect the term "women" in the category name, the method would filter out, for example, men's clothing items (possibly purchased as gifts) into an "Other" category. In some embodiments, the method may utilize one or more computer vision techniques to automatically categorize items into an "Other" category based on previous categorizations.

In step 420, the method prompts a user for a category if a match is found in step 416.

After determining that the item corresponds to an identified category, the method prompts the user to categorize the element into a subcategory. For example, the method may allow a user to categorize "women's" items into subcategories corresponding to types of clothing (e.g., shirts, pants, etc.). In some embodiments, the method may allow the user to create new categories and may save these new categories either for the wardrobe or globally.

In step 422, the method categorizes the item in a wardrobe based on the user category.

Finally, after identifying the appropriate category, the method categorizes the item in the user's wardrobe. In one embodiment, categorizing an item may comprise increasing a count associated with the number of items previously assigned to the category. Alternatively, or in conjunction with the foregoing, categorizing may additionally comprise updating a record associated with the item to indicate the appropriate categorization.

Figure 5A:
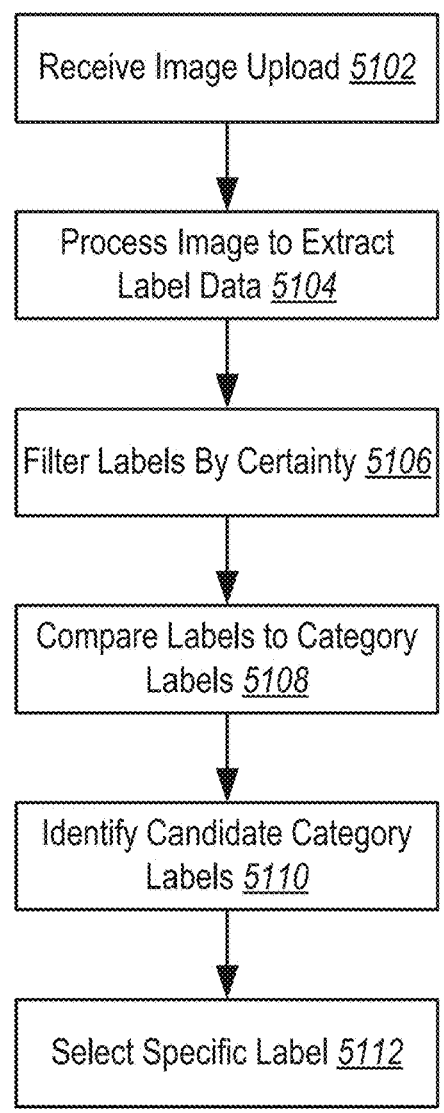
FIG. 5A is a flow diagram illustrating a method of converting an image to a structured representation of an item of merchandise according to some embodiments of the disclosure.

FIG. 5A is a flow diagram illustrating a method of converting an image to a structured representation of an item of merchandise according to some embodiments of the disclosure.

In step 5102, the method receives an image upload. In some embodiments, the method receives images uploads from a user via a user interface such as a website or mobile application. In alternative embodiments, the method may receive an image from a website of a merchant. In some embodiments, the image upload may comprise a photograph of a product or of a label or tag present on a physical item of merchandise.

In step 5104, the method processes the image to extract label data.

In some embodiments, processing an image may comprise pre-processing the image (e.g., aligning the image, adjusting the contrast of an image, converting the image to grayscale, etc.) prior to processing the image. In one embodiment, processing the image may comprise performing optical character recognition on the image to obtain a text file corresponding to the received image.

In some embodiments, after processing the image the method may extract label data regarding the photograph. In some embodiments, label data may comprise information regarding the purchase of an item including data present on a receipt such as the date purchased, a SKU of the item, an item description, the price of the item, etc. Alternatively, or in conjunction with the foregoing, the label data may include additional information such as the brand of the item, the materials of the item, an item color etc. In some embodiments, label data may comprise a data in a structured format such as JSON or XML.

In step 5106, the method filters the labels based on a certainty associated with each label.

In some embodiments, each piece of label data may be associated with a certainty level. In some embodiments, the certainty level represents the confidence that the data extracted from the image is accurate and may be represented as a percentage or interval. For example, the method may detect an item brand with an assigned certainty level of 90% and an item retailer with an assigned certainty level of 50%.

In step 5108, the method compares the labels to category labels.

In one embodiment, a given category may be associated with one or more labels. For example, a category of "Women's Shoes" may be assigned labels corresponding to certain brand names associated with the category. As an example, the method may compare the identified labels to determine if the extracted labels correspond to known category labels. For example, the method may determine that the extracted label "Manolo Blahnik" corresponds to the category "Women's Shoes." In some embodiments, the method may only analyze extracted labels having a certainty above a predetermined threshold.

In step 5110, the method identifies candidate labels and, in step 5112, selects a specific label.

In some embodiments, the comparison of extracted labels to category labels may result in numerous categories of varying granularity. For example, the label "Manolo Blahnik" may match the category labels "Shoes," "Women's Shoes," "Designer Shoes" and "Women's Designer Shoes." Such labels may be organized in a hierarchy. In the illustrated embodiment, the method selects the category having the finest granularity (E.g., "Women's Designer Shoes") as the appropriate category for the extracted label data. In this manner, the method is capable of converting a specific extracted label (e.g., a brand name) to a wardrobe category label (e.g., "Women's Designer Shoes") without requiring additional input from the user.

In some embodiments, prior to processing the image the method may determine if processing of an image is needed. For example, in some embodiments, the method may receive an image uploaded by a user that is associated with a product webpage. For example, the method may receive, via a browser extension, a URL of a product webpage that includes a photo. In this embodiment, the method may detect that the photo is not a photo taken a by a user and may already be associated with a category. If so, the method may bypass image processing and categorize the item using, for example, the techniques described in connection with FIG. 4.

Figure 5B:
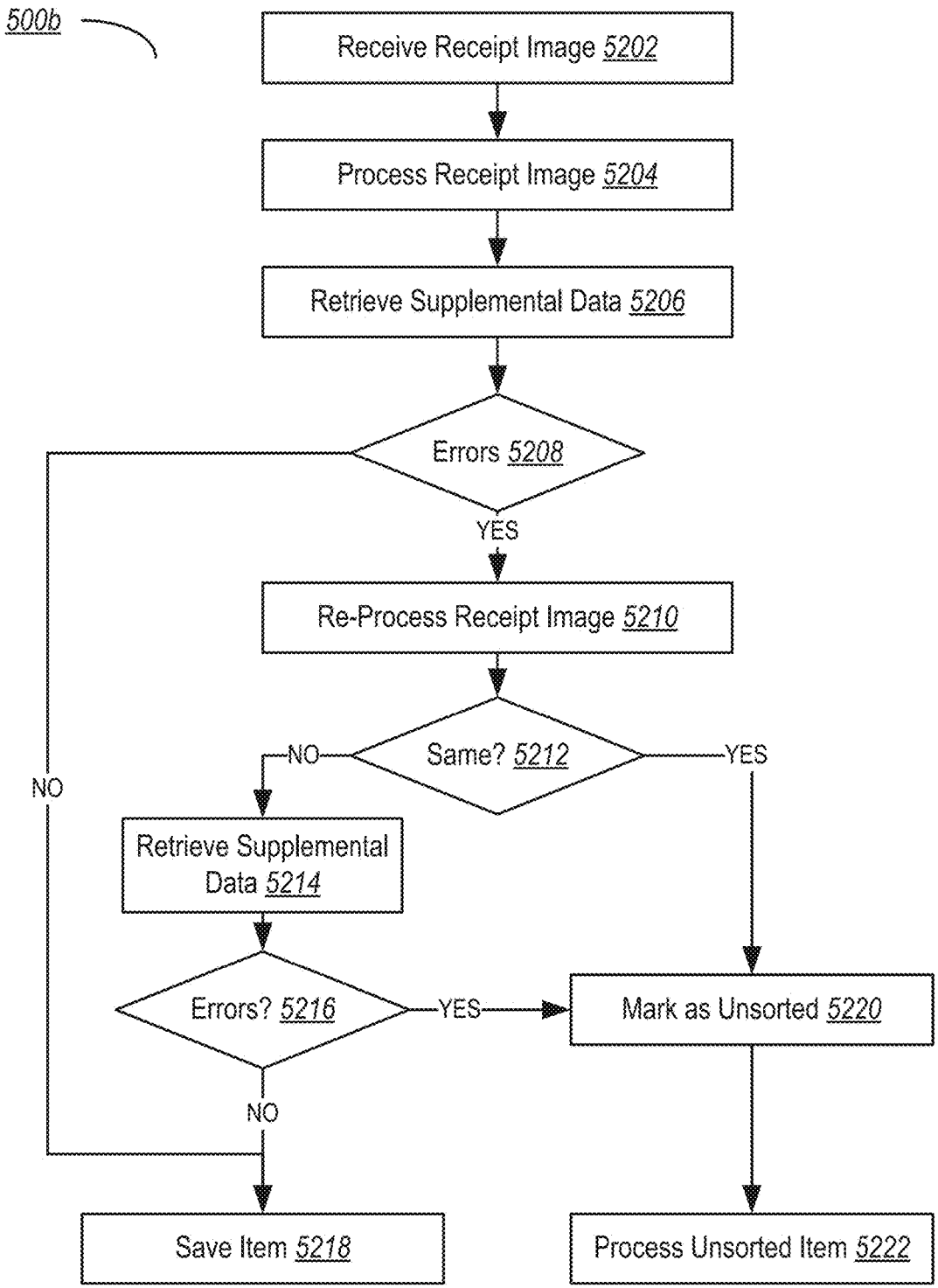
FIG. 5B is a flow diagram illustrating a method of processing an image of an item receipt according to some embodiments of the disclosure.

FIG. 5B is a flow diagram illustrating a method of processing an image of an item receipt according to some embodiments of the disclosure.

In step 5202, the method receives an image of a receipt. In some embodiments, an image of a receipt may be uploaded by a user to a specific e-mail address. In some embodiments, an e-mail account may be configured to transfer the image of the receipt for further processing.

In step 5204, the method processes the receipt image. In some embodiments, the method may first perform OCR operations on the image to extract textual content. In some embodiments, the method may utilize a machine learning algorithm to verify the accuracy of the OCR operations. In some embodiments, the method may utilize additional machine learning algorithms to assign item details to the image. In alternative embodiments, the method may utilize a crowdsourcing platform (e.g., Amazon Mechanical Turk) to perform the aforementioned operations.

In step 5206, the method retrieves supplemental data for the receipt image. As discussed previously, the method may query a third party database using an identifier of the item(s) extracted from the receipt image to retrieve supplemental data such as categories, brand names, colors, sizes, etc.

In step 5208, the method determines if any errors occurred while retrieving supplemental data in step 5206. In some embodiments, the details extracted from the receipt may be incorrect and thus retrieval of supplemental data may fail. Alternatively, if the method accurately retrieves supplemental data (and, by implication, accurately extracts item details), the method may proceed to save the item. Methods of saving an item are discussed more fully previously and are not repeated herein for the sake of clarity.

In step 5210, the method re-processes the receipt image. In some embodiments, the method may reprocess the image upon detecting that the retrieval of supplemental data has failed (and, by implication, the extracted item details are incorrect). In some embodiments, re-processing the receipt image may be performed in a manner similar to that described with respect to step 5204.

In step 5212, the method may determine whether the re-processed item details are the same as the processed item details from step 5204.

In step 5214, the method retrieves supplemental data upon determining that the pre-processed item details are different from those received in step 5204. Retrieving supplemental details may be performed in ways similar to step 5206.

In step 5216, the method determines if errors arose during step 5216. In some embodiments, the details extracted from the re-processed receipt may be incorrect and thus retrieval of supplemental data may fail. Alternatively, if the method accurately retrieves supplemental data (and, by implication, accurately extracts item details), the method may proceed to save the item in step 5218. Methods of saving an item are discussed more fully previously and are not repeated herein for the sake of clarity.

In step 5220, the method marks the item as unsorted if the method detects errors during a second supplemental data retrieval. The method may mark an item as unsorted to indicate that further processing may be needed due to repeated failures to accurately identify the item in the receipt image.

In step 5222, the method processes the unsorted item. In some embodiments, the method may transmit the receipt image (and optionally, processing results) to a human reviewer for manual review. In some embodiments, the method may utilize a crowdsourcing platform (e.g., Amazon Mechanical Turk) to perform a manual review. In some embodiments, the method may utilize third party databases to review the item receipt.

Figure 6:
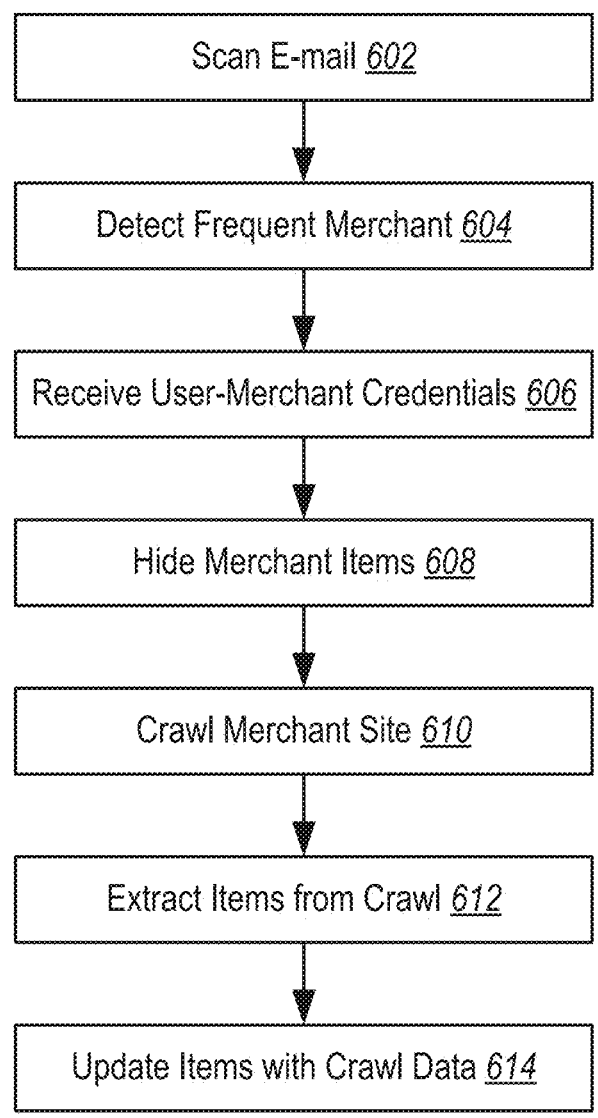
FIG. 6 is a flow diagram illustrating a method of extracting purchases of users from third-party merchants according to some embodiments of the disclosure.

FIG. 6 is a flow diagram illustrating a method of extracting purchases of users from third-party merchants according to some embodiments of the disclosure.

In step 602, the method scans an email. In some embodiments, scanning an email may be performed using the techniques discussed previously.

In step 604, the method detects a frequent merchant.

In some embodiments, the method may keep a running tally of the number of emails from merchants. Thus, the method may initialize a counter upon detecting a new merchant and may increment the counter each time an email from the merchant is identified. The method may then continually sort the merchants to identify merchants with whom the user frequently conducts commerce. In some embodiments, the method may use a predefined count (e.g., 50 emails) to classify a merchant as a frequent merchant. In some embodiments, this count may be dependent on a predefined time period (e.g., 50 emails during the last six months). In some embodiments, the method may additionally utilize a "whitelist" of merchants to limit the further processing steps to merchants appearing within the whitelist.

In step 606, the method receives user-merchant credentials.

In one embodiment, the method prompts the user for their credentials for the frequent merchant's website. In some embodiments, the credentials may comprise a username/email address and password the user utilizes to purchase items from the frequent merchant. In some embodiments, the method may additionally perform validations of the credentials (e.g., verifying the format of an email address, verifying the presence of a username/email address and/or password).

Alternatively, or in conjunction with the foregoing, the method may determine if the user does not enter credentials for the frequent merchant's website. If the user does not supply credentials, the method may continue processing items as described previously.

In some embodiments, the method may receive user credentials during the initial processing of emails. In alternative embodiments, the method may receive user credentials via a settings webpage or similar webpage. In this embodiment, the method may identify a frequent merchant and may store the identity of the frequent merchant in a user account for later retrieval. In this embodiment, the method allows the user to "restart" the method at step 606 at a later date.

In step 608, the method hides merchant items.

After receiving the user's credentials, the method may temporarily hide the items of the frequent merchant from the user wardrobe. In this embodiment, the method may be run in conjunction with the previous methods describing parsing and storing items in a user wardrobe discussed previously. By hiding the frequent merchant items, the method prevents the user from manipulating the items while the method continues processing the frequent merchant items. In the embodiment where a user enters credentials via a settings webpage, the method may hide the items already added to the user's wardrobe.

In step 610, the method crawls a website of the merchant.

In some embodiments, the method may utilize the user credentials and login to the frequent merchant's website. The method may then identify a section of the website that lists a user's purchases. In some embodiments, the method may utilize a predefine "script" for accessing a frequent merchant website. Specifically, a script may define a set of actions needed to simulate user activity on the website. For example, a script may include an identification of hyperlinks to "click" or otherwise follow to simulate a user accessing a list of purchases. Each merchant within the whitelist may be associated with a script to access a listing of purchases.

In step 612, the method extracts items from the crawl.

As discussed above, the method may access a script associated with the frequent merchant and execute the script using the user credentials. For example, the script may fill in the user credentials for a merchants site via a login URL, may "click" a hyperlink including the text "My Account," may then click a link including the text "Past Purchases," and may then select each hyperlink including a "href"

attribute matching a predefined pattern such as /^(http)?s? (:\/\/)?(www\.)?example.com\/orders\/\d*/. As discussed above, the specific "steps" in the script will vary depending on the identity of the frequent merchant.

As part of the crawl, the method may identify a plurality of pages including details regarding a user's orders. In some embodiments, the pages may include product pages or invoice pages. For each of these pages the method may extract details from the product page using XPath, XSLT, JavaScript, or other techniques for extracting data from HTML or XML documents.

In step 614, the method updates items with crawl data.

Figure 7A:
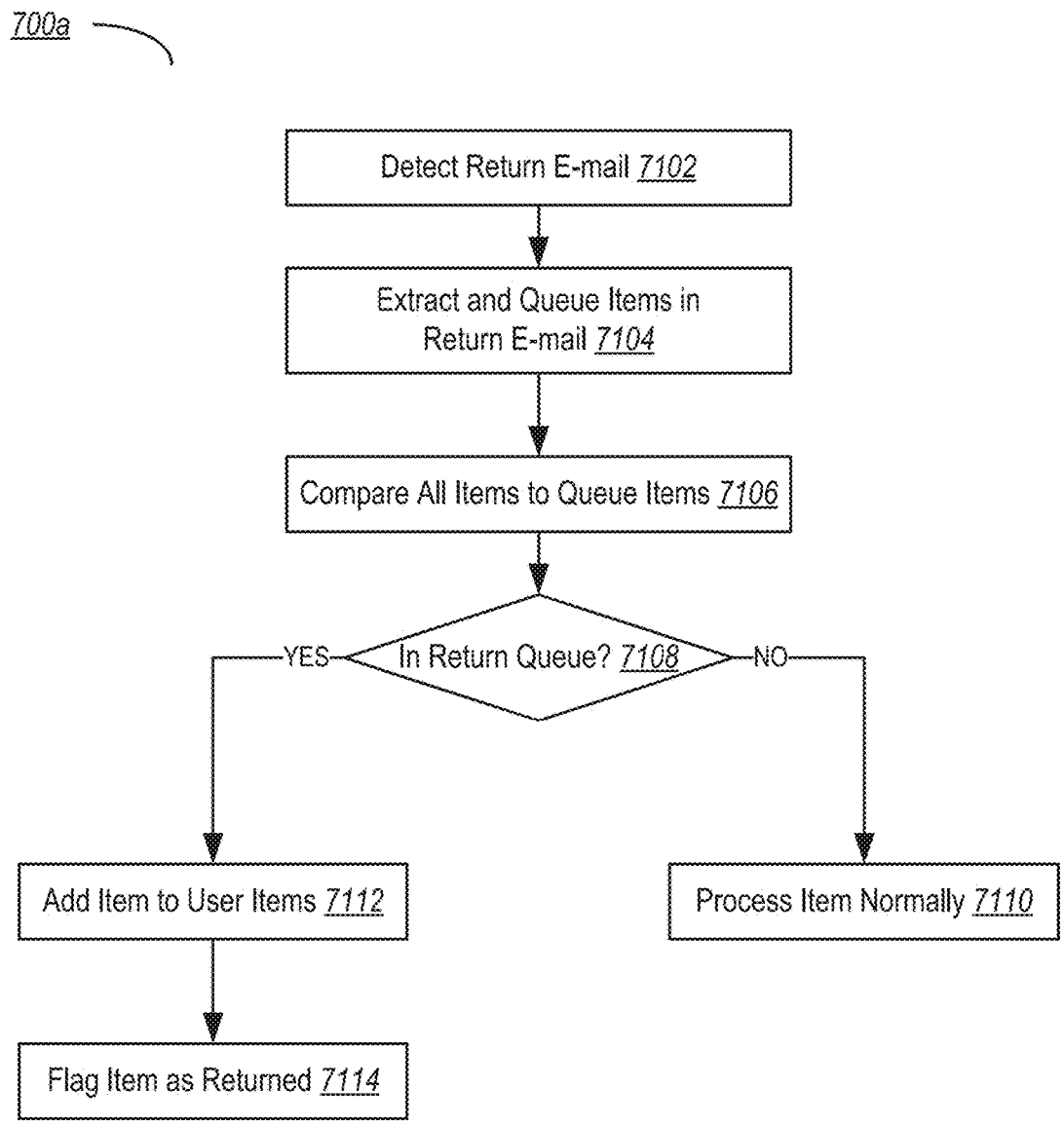
FIGS. 7A and 7B are flow diagrams illustrating methods of automatically detecting returned merchandise by parsing a user email account according to some embodiments of the disclosure.
Figure 7B:
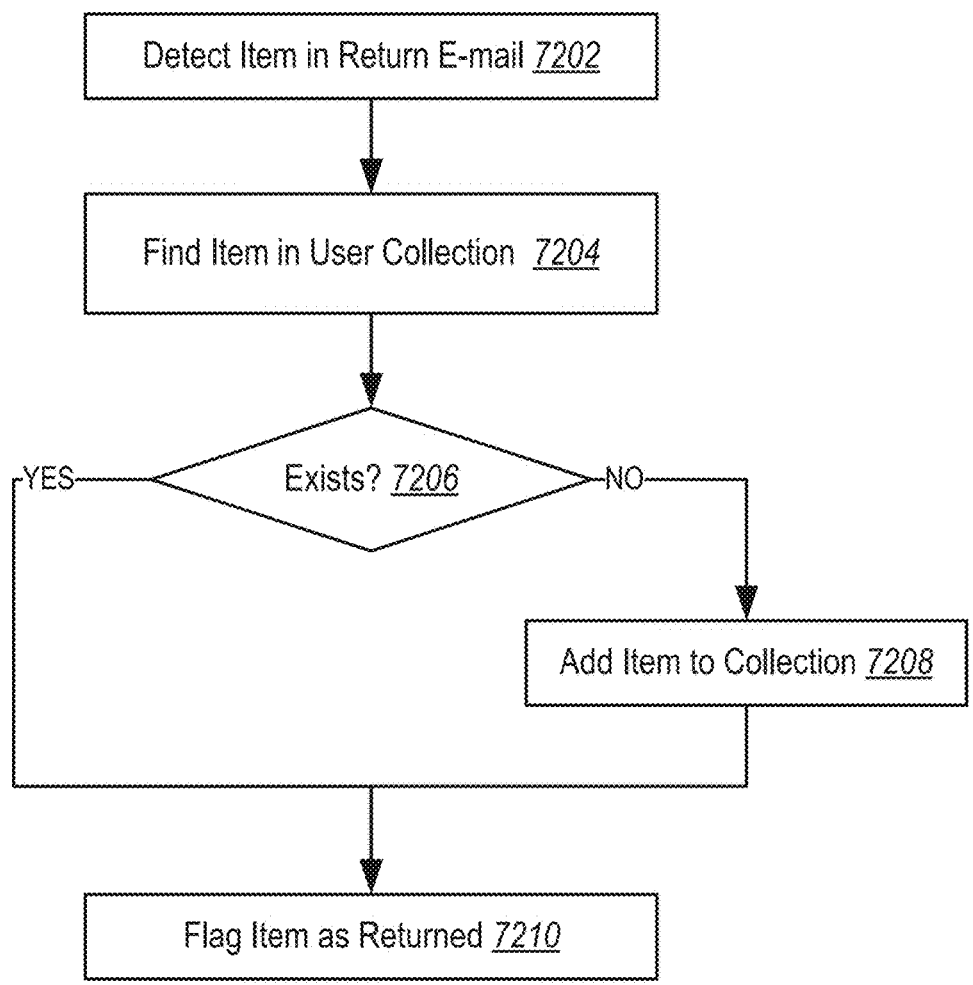

In the illustrated embodiment, after the method extracts item details from pages of a frequent merchant the method may cross reference the crawled items with the items extracted from corresponding user emails. In one embodiment, a user email may include an order identifier which may be used to identify the corresponding webpage provided by the corresponding merchant. In this manner, the method may supplement the details extracted from the user emails with additional data appearing on the frequent merchant webpages. For example, the method may extract additional images from the frequent merchant website associated with an item identified FIGS. 7A and 7B are flow diagrams illustrating methods of automatically detecting returned merchandise by parsing a user email account according to some embodiments of the disclosure.

In step 7102, the method detects a return email.

As discussed previously, the method may parse emails associated with a user account. In the illustrated embodiment, the method may operate as part of the initial processing of a user inbox to separately handle return item emails (as compared to receipt or purchase emails).

In one embodiment, the method may utilize a set of filters to detect that an email is not only from a merchant but also relates to a returned item. For example, the method may identify emails having a subject that includes the regular expression /return/i and, optionally, is associated with a known merchant return email.

In step 7104, the method extracts and queues items identified in the return email.

In one embodiment, the method may extract items from the return email using the methods discussed previously. Additionally, as illustrated, the method may place the detected item into a returned item queue for subsequent processing. In some embodiments, the returned item queue may be designed similar to the inbox queues discussed previously.

In step 7106, the method compares all of the user's items to items in the queue and, in step 7108, determines if the item is in the return queue.

In this step, the method may execute a job previously queued in step 7104. In one embodiment, the method only selects the user's items that were not previously marked as returned. In one embodiment, the method may extract all of the identifiers of the user's non-returned items and compare the list of identifiers to the identifiers of the queued return items.

In step 7110, the method continues to processes the return item normally if the item is not in the return queue. The normal processing of emails is discussed more fully previously. In step 7112, the method adds the identified return item to the user's items and, in step 7114, marks the item as returned.

In the illustrated embodiment, adding an item to the user items may comprise adding the item to a user wardrobe. In some embodiments, the method may bypass the supplementing of the item with data from third parties as discussed previously. Additionally, the method marks the item as returned by setting a flag on the item stored in the user's wardrobe. Alternatively, or in conjunction with the foregoing, the method may additionally add the date of the return email as a returned date for the item.

While the method illustrated in FIG. 7A may be run upon a user account registration, the method illustrated in FIG. 7B may be run periodically after a user has registered an account.

In step 7202, the method detects an item in a return email.

As discussed previously, the method may be run continuously after a user registered an account. Thus, the method may continuously parse incoming user emails to detect return emails.

In one embodiment, the method may utilize a set of filters to detect that an email is not only from a merchant but also relates to a returned item. For example, the method may identify emails having a subject that includes the regular expression /return/i and, optionally, is associated with a known merchant sender as a return email.

In step 7204, the method identifies the returned item(s) in the user items.

As discussed, a user may be associated with one or more items in wardrobe. In step 7204 the method cross references the extracted return item with the one or more saved items. In this manner, the method confirms that the return item corresponds to an existing item in the user wardrobe. In some embodiments, the method may utilize an identifier of the item to perform this check.

In step 7206, the method confirms whether the returned item exists in the user collection.

If the method determines that the returned item has not been added to the user collection, the method adds the returned item to the user's wardrobe collection in step 7208. Alternatively, if the method determines that the returned item is already in the user's wardrobe the method continues to step 7210.

In step 7210, the method marks the returned item as returned.

In one embodiment, marking an item as returned may comprise setting a flag on the item stored in the user's wardrobe. Alternatively, or in conjunction with the foregoing, the method may additionally add the date of the return email as a returned date for the item. Alternatively, or in conjunction with the foregoing, the method may additionally notify the user that an item was flagged as returned so as to notify the user and allow the user to override the method.

Figure 8:
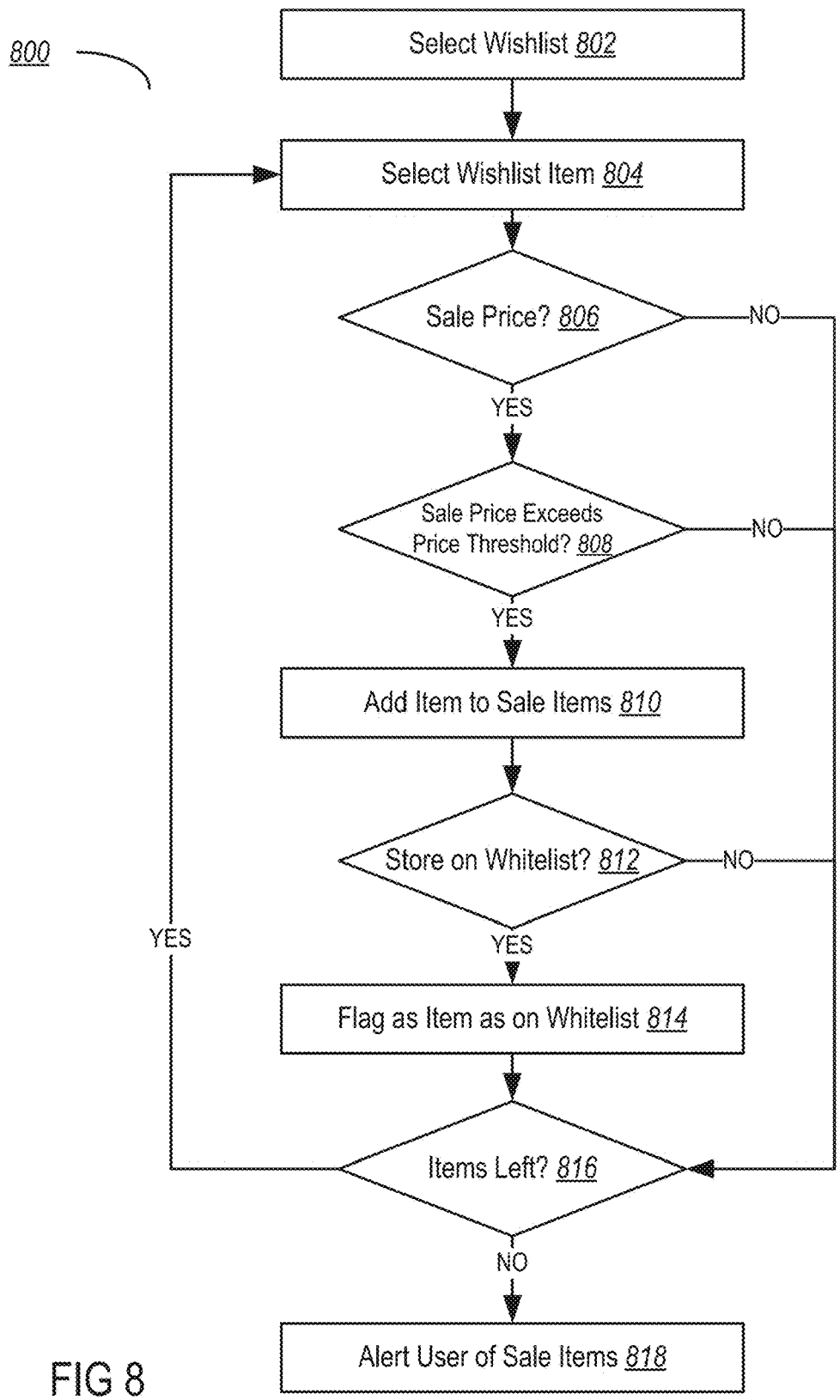
FIG. 8 is a flow diagram illustrating a method of recommending on-sale items to users by parsing user wardrobes according to some embodiments of the disclosure.

FIG. 8 is a flow diagram illustrating a method of recommending on-sale items to users by parsing user wardrobes according to some embodiments of the disclosure.

In step 802, the method selects a wishlist.

In the illustrated embodiment, a system may allow a user to create a wishlist of items that the user may desire to purchase in the future. In some embodiments, items may be added via a website or mobile application. Alternatively, or in conjunction with the foregoing, the method may allow for the addition of items using a browser extension or other mechanism. In some embodiments, items in a wishlist may be processed similar to items extracted from emails as discussed previously.

In step 804, the method selects an item in the wishlist and performs a series of checks to determine if an item in the wishlist is currently on sale.

In step 806, the method determines if the item has a sale price.

In some embodiments, the method may extract an identifier associated with a wishlist item and may query a database that includes pricing information associated with the product. In one embodiment, the database may include an original price and a sale price updated periodically by a merchant. In step 806, if the method determines that a sale price does not exist the method may continue to analyze the remaining items in the list, step 816.

In step 808, the method determines if the sale price exceeds a price threshold.

As discussed, at step 808, the method obtains an original price and at least one sale price associated with a wishlist item. In the illustrated embodiment, the method may calculate a price difference between the sale price and original price to determine whether further processing is needed. In one embodiment, the method may determine if the sale price is greater than 5% cheaper than the original price or less than 80% cheaper.

In step 810, the method adds the item to a list of sale items.

In one embodiment, adding an item to a list of sale items may comprise marking a record associated with the sale item as on sale by setting a "sale" field of the item. Additionally, the method may store the sale price and a URL of the sale item with the item.

In step 812, the method determines if the store associated with the sale is on a whitelist. In some embodiments, a whitelist of merchants may be maintained to only allow sale prices to be accepted for a known set of merchants.

If the method determines that the merchant is not on the whitelist, the method may continue to parse the remaining wishlist items, step 816. Alternatively, if the merchant is on the whitelist, the method may flag the item as on the merchant whitelist. In some embodiments, a whitelist may be used to prevent alerting users to fraudulent or disreputable stores or retailers.

In step 818, after reviewing each item on the wishlist the method alerts the user of sale items. In one embodiment, the method may only alert those items flagged in step 814. That is, only items on sale at whitelisted merchants. In some embodiments, alerting a user may comprise generating an email listing the on sale items and transmitting the email to a user a predetermined time. In some embodiments, the time may be selected based on the timing of a sale associated with an item.

Figure 9:
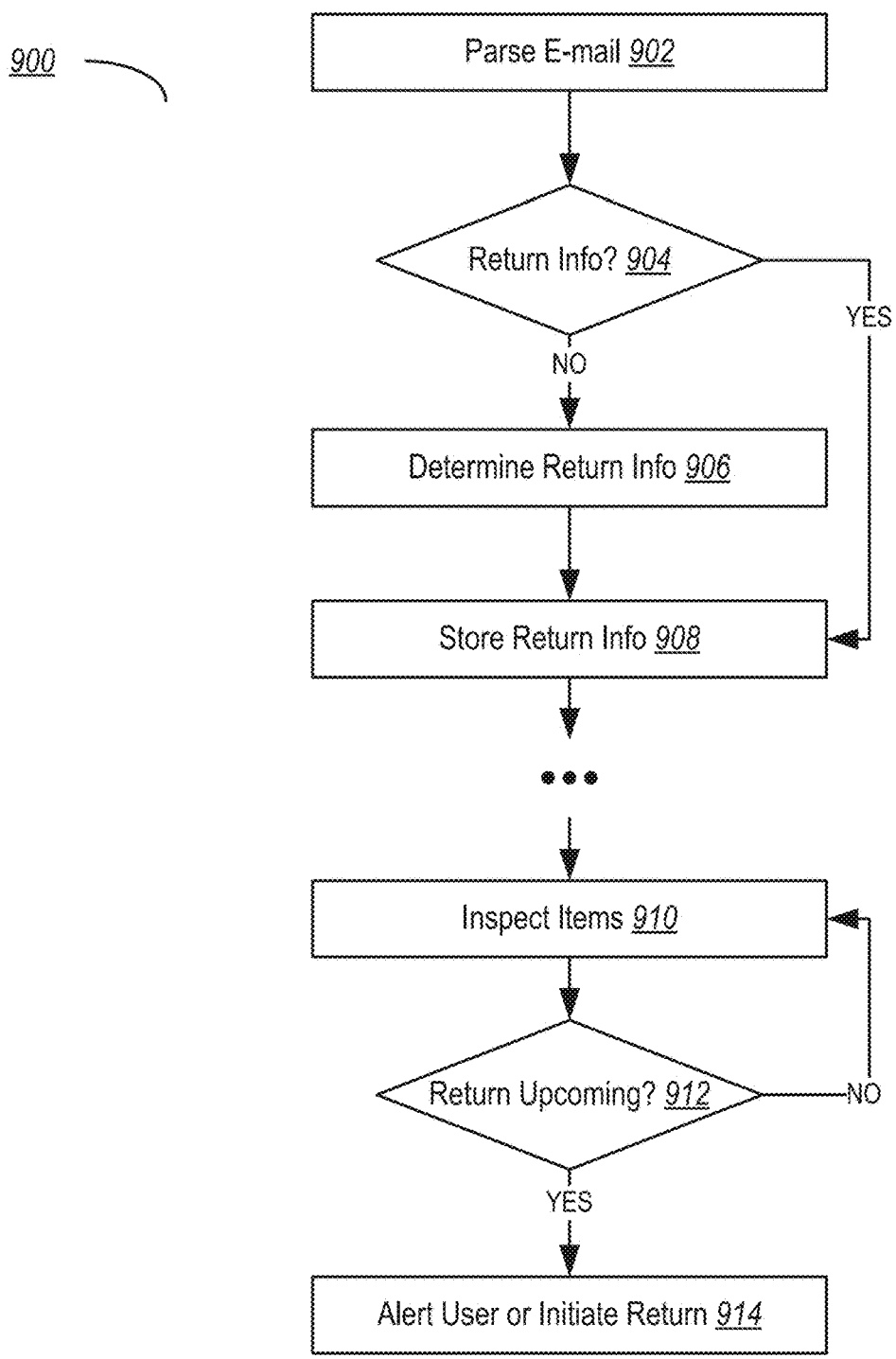
FIG. 9 is a flow diagram illustrating a method of automatically initiating the return of merchandise according to some embodiments of the disclosure.

FIG. 9 is a flow diagram illustrating a method of automatically initiating the return of merchandise according to some embodiments of the disclosure.

In step 902, the method parses an email. In the illustrated embodiment, parsing an email may be performed in a manner similar to methods described previously with respect to parsing a user's email messages.

In step 904, the method determines if return information is present within the email. In some embodiments, merchants may transmit email messages to users upon purchases that include information regarding how to return an item (e.g., a hyperlink, form or other mechanism) and important dates for returning items. If the email includes this information, the method may continue to step 908.

Alternatively, in step 906, the method determines return info if the email message does not include return information.

Notably, some merchants may transmit emails indicating a purchase but fail to include additional return information (e.g., links to generate return packaging). In this scenario, the method may calculate the return information using an identifier of the product. For example, the method may crawl a merchant website (as discussed previously) to retrieve information regarding the return process (e.g., a return hyperlink on an invoice page or a form or a return date).

In step 908, the method stores return information. In one embodiment, storing return information may comprise storing a return date, hyperlink to a return page, or other information the user requires to facilitate the return.

In step 910, the method inspects items. As illustrated, the method may periodically inspect items that have included return information. Specifically, the method may filter a user wardrobe to retrieve only those items that were associated with return info in step 908.

In step 912, the method next identifies whether a return date is upcoming.

In one embodiment, the method determines if a return is upcoming by identifying the latest date the user may return the item. As discussed above, the method may extract the last day the user may return from an email for from a merchant site. Thus, the method may compare the current date to the return date and determine whether the current date is within a predefined range (e.g., 1 week) of the last possible return date.

In step 914, the method alerts the user of the upcoming return or automatically initiates the return.

In a first embodiment, the method may email the user to alert them that an upcoming return deadline is approaching. Alternatively, or in conjunction with the foregoing, the method may additionally provide helpful information regarding the return (e.g., a hyperlink to return the item, return processing information, etc.).

Alternatively, or in conjunction with the foregoing, the method may automatically initiate the return. As described above, the method may store information necessary to complete a return (e.g., a hyperlink to request a return). In one embodiment, the method may automatically select, for example, the hyperlink to initiate the return. In some embodiments, the method may simulate a user login (discussed previously) to initiate a return. In these embodiments, the method may alert the user that a return was initiated after automatically initiating the return.

Figure 10:
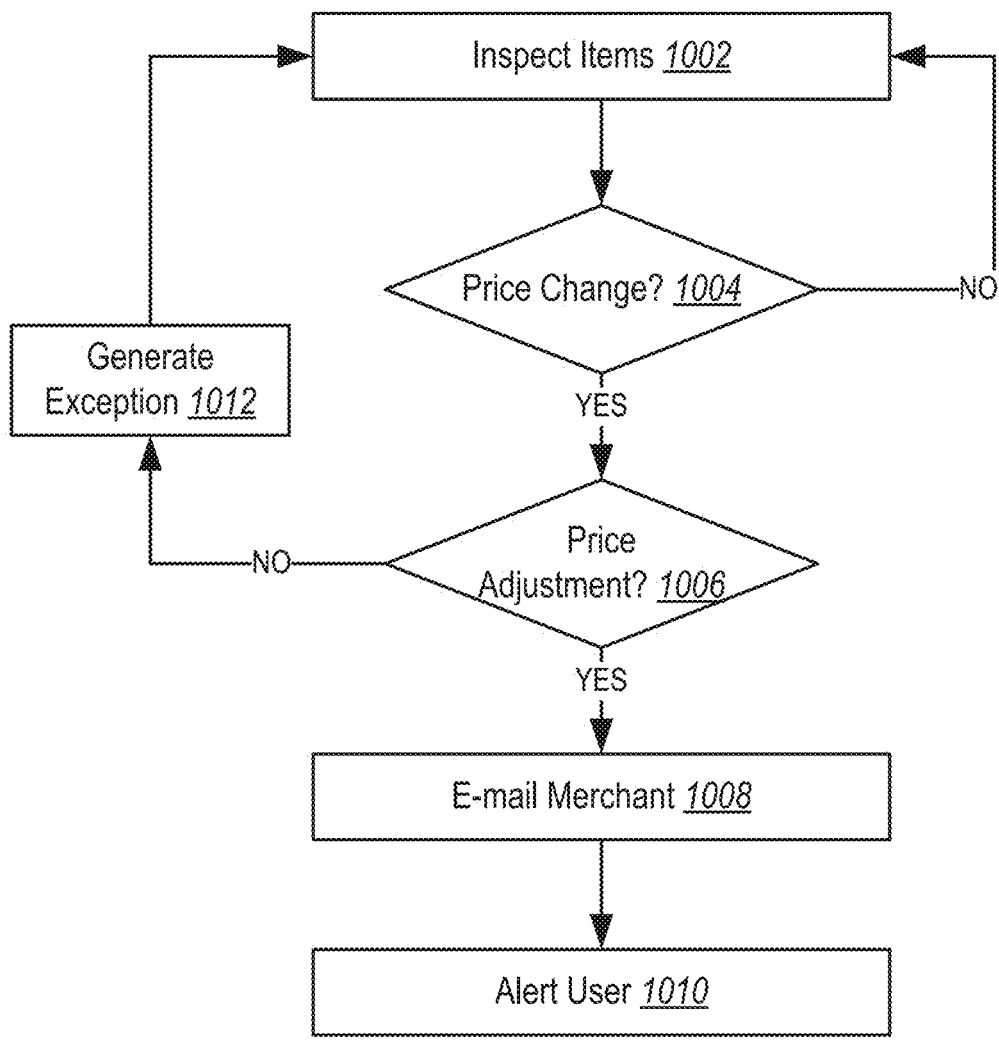
FIG. 10 is a flow diagram illustrating a method of automatically detecting price adjustments of merchandise according to some embodiments of the disclosure.

FIG. 10 is a flow diagram illustrating a method of automatically detecting price adjustments of merchandise according to some embodiments of the disclosure.

In step 1002, the method inspects items. In one embodiment, inspecting items may comprise periodically inspecting items saved to a user wardrobe.

In step 1004, the method determines whether a price associated with an item has changed. In some embodiments, the method may query a third party database or merchant website to retrieve a current price for an item. In some embodiments, the method may crawl a merchant website using the credentials of a user to identify a current price as discussed previously. If the price has not changed, the method continues to process the remaining items.

In step 1006, the method determines if the change in price should trigger a price adjustment.

In some embodiments, the method may determine if the change in price is between 2.5% or 90% of the original price, while other limits may be utilized depending on the needs of the application. In this manner, the method filters minor or extreme price fluctuations since minor fluctuations may be available for a price adjustment and major price changes may indicate errors in the underlying data.

In step 1012, the method generates an exception if the price change is not within the defined limits. In some embodiments, the generation of an exception may only be raised if the price change is excessive (e.g., 90% of the original price). Alternatively, or in conjunction with the foregoing, an exception may be raised in all cases to allow for inspection of the price change.

In step 1008, the method emails a merchant.

In some embodiments, the method may automatically email a merchant to request a price adjustment. In some embodiments, the method may only email a merchant if a setting is set by the user allowing the automatic email. In some embodiments, the email may be sent by a third party while in other embodiments, the email may be sent from the user's email account. In some embodiments, the method may email an email address associated with the merchant which may be associated with the item or may be extracted from the merchant website.

In step 1010, the method alerts the user.

In some embodiments, the method may bypass emailing a merchant and may only alert a user depending on the user's preferences. In some embodiments, alerting a user may comprise emailing a user.

Figure 11:
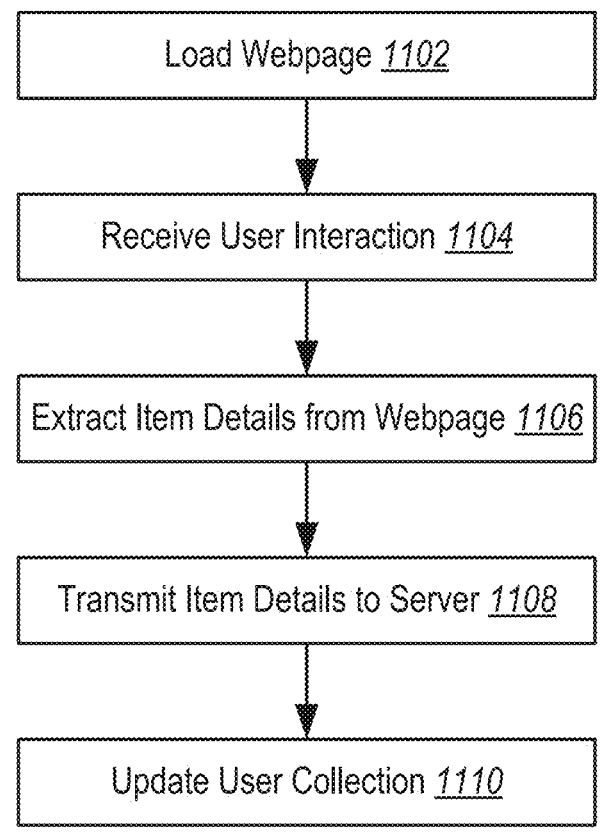
FIG. 11 is a flow diagram illustrating a method of facilitating saving of merchandise from third-party webpages according to some embodiments of the disclosure.

FIG. 11 is a flow diagram illustrating a method of facilitating saving of merchandise from third party webpages according to some embodiments of the disclosure.

In step 1102, the method loads a webpage.

In some embodiments, a webpage may correspond to a webpage provided by a merchant. In some embodiments, the webpage may be a product page.

In step 1104, the method receives a user interaction.

In some embodiments, the user interaction may be an interaction with a browser extension or helper object. In some embodiments, the user interaction may be a user interaction with a browser toolbar item. Alternatively, or in conjunction with the foregoing, the user interaction may be a user interaction with a bookmarklet or context menu item. Alternatively, or in conjunction with the foregoing, the user interaction may be a user interaction with a feature of the webpage itself.

In step 1106, the method extracts item details from the webpage.

As discussed previously, the webpage may include details regarding an item. As such, the webpage may include information relating to the product such as a product name, brand name, SKU number, price, images, and other details. In some embodiments, the method may utilize a template for a given webpage in order to identify the item details from the webpage. For example, the method may utilize XPath expressions associated with a given website to extract item details.

In step 1108, the method transmits the item details to a server.

In some embodiments, the method packages the item details into a payload for transmission to a server hosting a user item collection. In some embodiments, transmitting item details may comprise transmitting the items to an API endpoint. In some embodiments, the method may additionally authenticate a user prior to transmitting the items details.

In step 1110, the method updates a user item collection in response to the item details.

As discussed previously, a user may be associated with one or more items extracted from the user's email. In the illustrated embodiment, the method receives the item payload and may add the item associated with the webpage to the user collection, thus supplementing the items identified in the user email. In some embodiments, the method may add the items directly to a user wardrobe. In alternative embodiments, the method may add the items to a wishlist or other collection of items. In some embodiments, the item details stored in the user collection may additionally include the URL of the webpage where the user interaction was detected.

Figure 12:
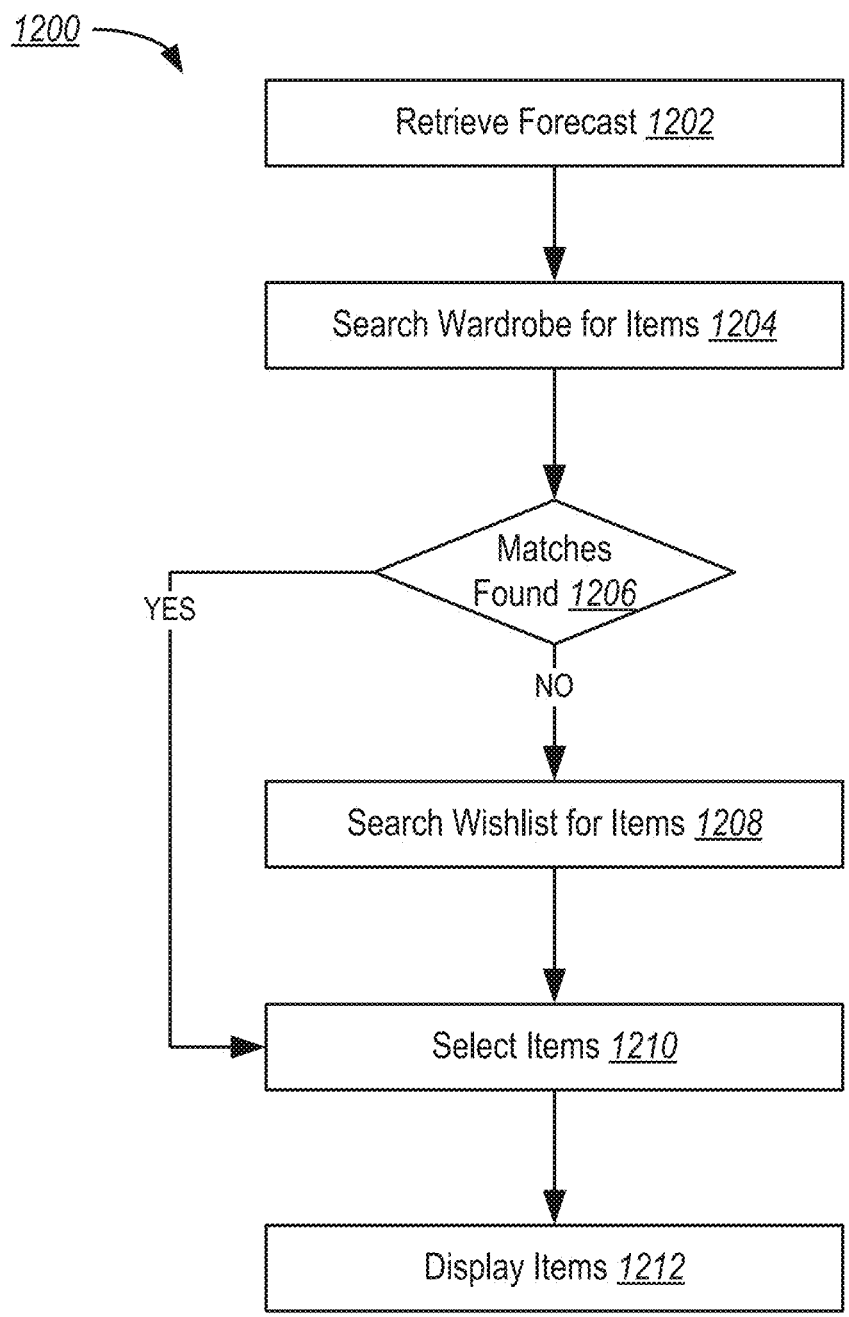
FIG. 12 is a flow diagram illustrating a method of recommending products based on weather forecasts according to some embodiments of the disclosure.

FIG. 12 is a flow diagram illustrating a method of recommending products based on weather forecasts according to some embodiments of the disclosure.

In step 1202, the method retrieves a forecast.

In some embodiments, the method may retrieve a forecast from a third party weather provider via an API. In some embodiments, the method may retrieve the forecast in response to a user request for a wardrobe recommendation. In some embodiments, the user's location may be identified via a user profile associated with the user. In alternative embodiments, the user's location may be identified via the user's actual location (e.g., via a geolocation API of a mobile device). In alternative embodiments, the method may utilize trip details of a user in determining the appropriate forecast. For example, the user may indicate an upcoming vacation, the location of which may be utilized to retrieve the appropriate forecast.

In step 1204, the method searches for items in the user's wardrobe for items.

In the illustrated embodiment, the method may search for wardrobe items matching the received weather forecast. In some embodiments, each item in the wardrobe may be associated with a weather "type" (e.g., cold weather, rainy weather, etc.). In this embodiment, the method may filter the user items based on the type associated weather. Alternatively, or in conjunction with the foregoing, each item may be associated with a category which implicitly is associated with a forecast type. For example, a category "Raincoats" may be associated with rainy and/or snowy weather. In this embodiment, the method may filter those items having a category matching the forecast.

In step 1206, the method determines if matching items exist in the user's wardrobe.

If so, the method selects the matching items in step 1210.

If not, the method searches a user's wishlist for matching items in step 1208. The steps of matching a wishlist item to a forecast may be similar to those discussed in connection with step 1204.

In step 1212, the method displays the matching items.

In some embodiments, the method may display a listing of potential items to a user based on the forecast, thus allowing the user to select items appropriate for the retrieved forecast. In some embodiments, the method may additionally allow users to create outfits, thus allowing users to plan for trips or future weather.

Figure 13A:
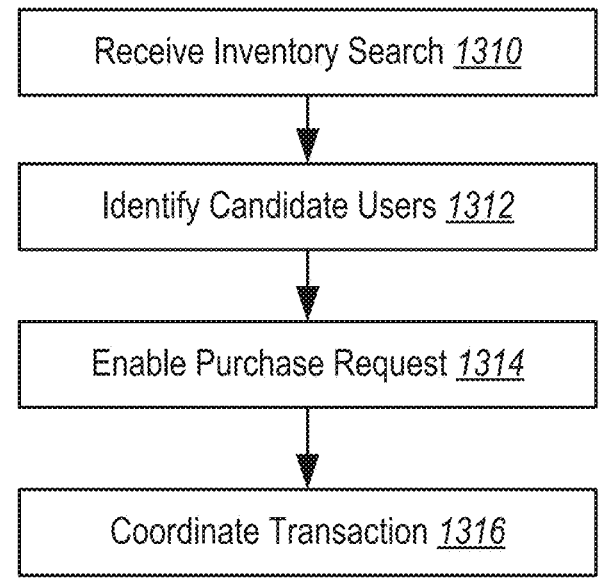
FIG. 13A is a flow diagram illustrating a method of facilitating the purchase of merchandise by re-commerce entities according to some embodiments of the disclosure.

FIG. 13A is a flow diagram illustrating a method of facilitating the purchase of merchandise by re-commerce entities according to some embodiments of the disclosure.

In step 1310, the method receives an inventory search. In some embodiments, a system may allow re-commerce sites to search users' wardrobes to identify items the re-commerce may be interested in purchasing for resale. In some embodiments, the system may allow a re-commerce site to search for items by brand name, item name, SKU number, price, etc.

In step 1312, the method identifies a set of candidate users that meet the search parameters. In some embodiments, the method uses the inventor search to identify those users that match the re-commerce entities inventory search. In some embodiments, the users may comprise users matching the parameters of the search. Alternatively, or in conjunction with the foregoing, the method may identify users similar to users who match the search parameters.

In some embodiments, the method may additionally transmit details regarding the users and or the items to the re-commerce entity. For example, the method may verify a user actually owns the item and may provide the amount of time the user has owned (and/or worn) the item.

In step 1314, the method enables the re-commerce entity to make a purchase request. In some embodiments, a purchase request may comprise transmitting an email to a user indicating that an entity would like to purchase a user's item or items. In some embodiments, the request may additionally include a price. In some embodiments, the price may include a starting "bid" and may allow the user to present a counter offer. In some embodiments, this bidding process may continue until an agreed price is or is not reached.

In step 1316, the method coordinates the transaction between the user and re-commerce provider. In some embodiments, coordinating a transaction may comprise facilitating payment and shipping of the item between the parties.

Figure 13B:
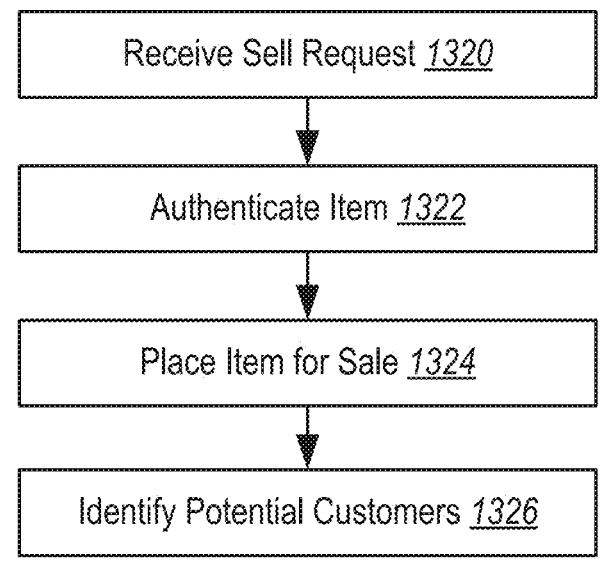
FIG. 13B is a flow diagram illustrating a method for providing a peer-to-peer marketplace according to some embodiments of the disclosure.

FIG. 13B is a flow diagram illustrating a method for providing a peer-to-peer marketplace according to some embodiments of the disclosure.

In step 1320, the method receives a sell request for an item in a user's wardrobe from the user. In some embodiments, the method may enable a user to select an item and indicate that the user would like to sell the item in the user's wardrobe. In some embodiments, a user may utilize a website or mobile application to initiate the selling process.

In step 1322, the method authenticates the item. In some embodiments, the method may ensure that the item the user wishes to sell corresponds to a purchase receipt received via email. Additionally, the method may confirm that the user has not returned the item. Additionally, the method may confirm that the item was actually delivered to the user. Additionally, the method may measure the user's purchase velocity or analyze the user's purchase history to determine whether the user is a legitimate seller. Additionally, the method may utilize the user's location to determine if the user is legitimate or illegitimate.

In step 1324, the method places the item for sale. In some embodiments, placing the item for sale may comprise listing the item on a web-based or mobile-based marketplace. In some embodiments, the market place may list details regarding the item and seller including the amount of time owned, the number of times worn, the price paid, etc.

In step 1326, the method optionally identifies potential customers. Since the method has access to user wardrobes, the method may compare the item to wardrobes of other users in order to facilitate transactions. For example, the method may first exclude users who already own the item. The method may also identify users who have the item in their wishlist. The method may also segment users based on wardrobe preferences or cluster users based on purchase histories.

Figure 14:
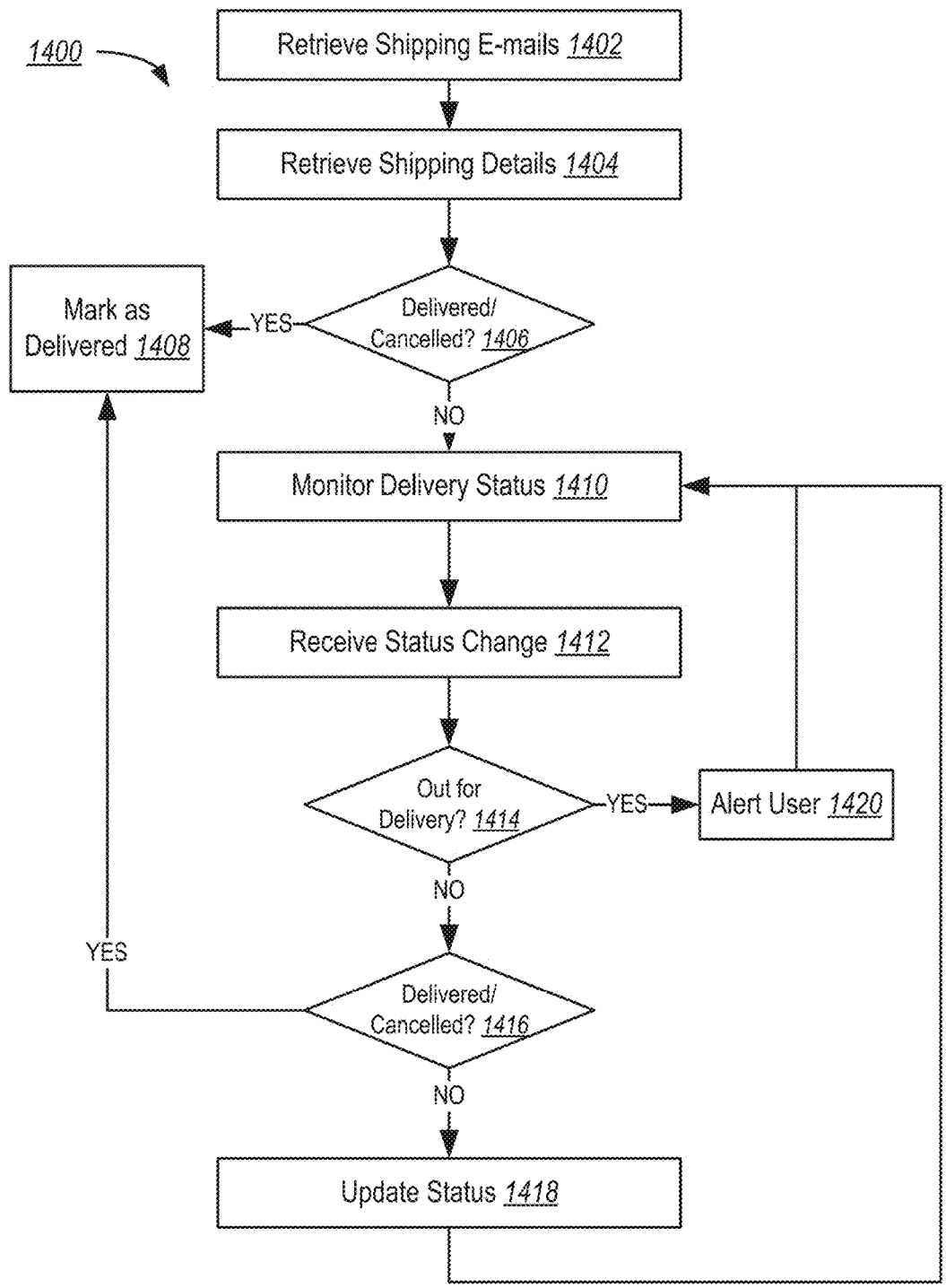
FIG. 14 is a flow diagram illustrating a method of tracking packages according to some embodiments of the disclosure.

FIG. 14 is a flow diagram illustrating a method of tracking packages according to some embodiments of the disclosure.

In step 1402, the method retrieves shipping emails received at a user account.

In step 1404, the method retrieves shipping details associated with the email.

In some embodiments, retrieving shipping details may comprise extracting shipping parameters (e.g., carrier, tracking number, etc.) from the email itself. Alternatively, or in conjunction with the foregoing, the method may query a shipping company database to retrieve data relating to the shipping email. Alternatively, or in conjunction with the foregoing, the method may retrieve shipping details from a merchant's website.

In step 1406, the method determines if the order was delivered or cancelled. In some embodiments, the shipping information retrieved in step 1404 includes an indication of the status of the shipment.

In step 1408, the method marks the item as delivered.

As discussed previously, a user may be associated with a wardrobe of purchased items. Thus, the method may update a record associated with the item if the item was determined to be delivered. Alternatively, or in conjunction with the foregoing, the method may mark the item as "cancelled" if the order was cancelled or may remove the item from the user's wardrobe if detecting the order was cancelled.

In step 1410, the method monitors the delivery status of an order if it is determined that the delivery is pending.

In some embodiments, the method may access a shipping API or database to periodically determine the status of orders. In alternative embodiments, the method may crawl one or more webpages to retrieve shipping details.

In step 1412, the method receives a change in status of delivery. Examples of changes include the marking of a shipment as "out for delivery" or "in transit." In some embodiments, the status may be "pushed" to the method. In alternative embodiments, the method may actively retrieve shipment statuses.

In step 1414, the method determines if the shipments status was changed to "out for delivery" and if so, the method may alert the user of the change in status, step 1420. In some embodiments, alerting a user may comprise sending an email, SMS, or other message to the user alerting them that the shipment is out for delivery.

In step 1416, the method determines if the order was delivered or cancelled. In this step, the method ensures that packages out for delivery have been delivered. If the package changes from "out for delivery" to delivered or cancelled, the method marks the item as delivered or canceled in step 1408. In some embodiments, the method may additionally alert the user when the shipment was delivered and/or cancelled.

In step 1418, the method updates the status of the shipment if the previous conditions are not met. That is, the method may continually update the status of the shipment to allow a user to view the status of shipments while reserving notifications for certain events.

Figure 15:
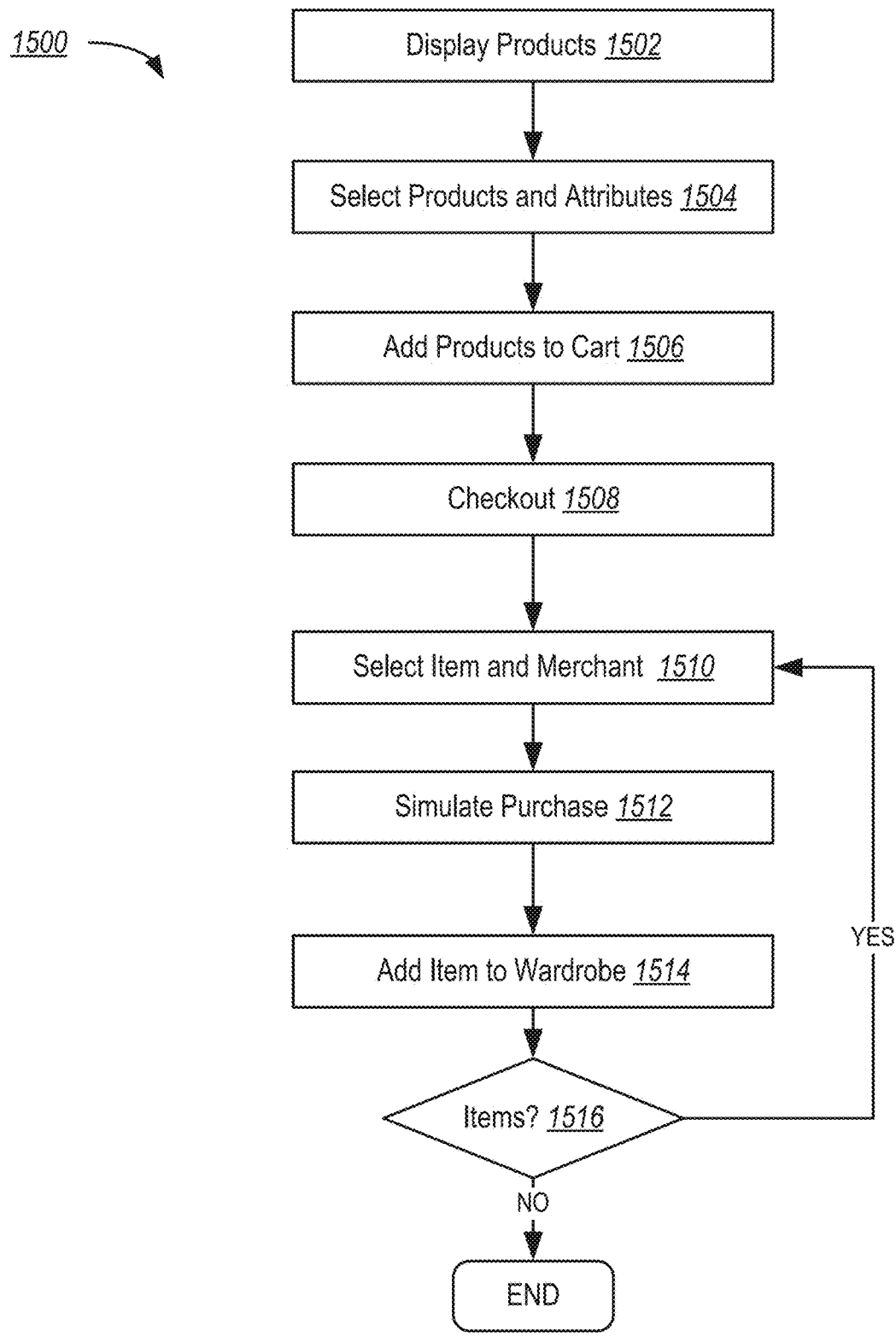
FIG. 15 is a flow diagram illustrating a method for providing a universal shopping cart according to some embodiments of the disclosure.

FIG. 15 is a flow diagram illustrating a method for providing a universal shopping cart according to some embodiments of the disclosure.

In step 1502, the method displays products. In some embodiments, the method may display products from a variety of different merchants and/or from a variety of different brands. In some embodiments, each of the products may be stored in a products database or may be retrieved from a third party service.

In step 1504, the method selects products and attributes for the products. In one embodiment, the method enables a user to select a product and configure the product according to predefined options. For example, the method may allow the user to select the color or size of a product.

In step 1506, the method adds the product to a cart (e.g., a session-based storage area) and may initiate a checkout procedure in response to user input, step 1508.

Upon checkout, the method may select an item in the user's cart and identify a merchant associated with the item, step 1510. In some embodiments, selecting a merchant may comprise identifying a merchant website and a "script" that allows the method to perform further interactions with the webpage.

In step 1512, the method simulates a purchase of the item at the merchant website. In one embodiment, simulating a purchase may comprise loading the "script" associated with merchant and executing the script. In one embodiment, a script corresponds to a set of steps that simulate a user browsing session. For example, the script may include the actions of visiting a product page, configuring options (e.g., color, size, etc.), clicking a checkout button, filling in credit card and/or shipping details, and clicking an "order" button. In some embodiments, the method may additionally allow for the entering of "promotional codes" for merchants. In some embodiments, these codes may be supplied by the user or, alternatively, may be determined by the server executing the method (e.g., via crawling social media). Alternatively, or in conjunction with the foregoing, the method may be configured to differentiate between shipping methods (e.g., based on user preferences for slower or faster shipping). Alternatively, or in conjunction with the foregoing, the method may be configured to detect that an item is no longer available on a merchant site. In this embodiment, the method may notify the user of the missing item or may, alternatively, or in conjunction with the foregoing, provide a list of suggestions on where to purchase the item based on a database of products.

In step 1514 the method may add the purchased item to the user's wardrobe as discussed previously and may continue to purchase items, step 1516.

The subject matter described above may be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The description presented above is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

These computer program instructions can be provided to a processor of: a general purpose computer to alter its function to a special purpose; a special purpose computer; ASIC; or other programmable digital data processing apparatus, such that the instructions, which execute via the processor of the computer or other programmable data processing apparatus, implement the functions/acts specified in the block diagrams or operational block or blocks, thereby transforming their functionality in accordance with embodiments herein.

For the purposes of this disclosure a computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

For the purposes of this disclosure the term "server" should be understood to refer to a service point which provides processing, database, and communication facilities. By way of example, and not limitation, the term "server" can refer to a single, physical processor with associated communications and data storage and database facilities, or it can refer to a networked or clustered complex of processors and associated network and storage devices, as well as operating software and one or more database systems and application software that support the services provided by the server. Servers may vary widely in configuration or capabilities, but generally a server may include one or more central processing units and memory. A server may also include one or more mass storage devices, one or more power supplies, one or more wired or wireless network interfaces, one or more input/output interfaces, or one or more operating systems, such as Windows Server, Mac OS X, Unix, Linux, FreeBSD, or the like.

For the purposes of this disclosure a "network" should be understood to refer to a network that may couple devices so that communications may be exchanged, such as between a server and a client device or other types of devices, including between wireless devices coupled via a wireless network, for example. A network may also include mass storage, such as network attached storage (NAS), a storage area network (SAN), or other forms of computer or machine readable media, for example. A network may include the Internet, one or more local area networks (LANs), one or more wide area networks (WANs), wire-line type connections, wireless type connections, cellular or any combination thereof. Likewise, sub-networks, which may employ differing architectures or may be compliant or compatible with differing protocols, may interoperate within a larger network. Various types of devices may, for example, be made available to provide an interoperable capability for differing architectures or protocols. As one illustrative example, a router may provide a link between otherwise separate and independent LANs.

A communication link or channel may include, for example, analog telephone lines, such as a twisted wire pair, a coaxial cable, full or fractional digital lines including T1, T2, T3, or T4 type lines, Integrated Services Digital Networks (ISDNs), Digital Subscriber Lines (DSLs), wireless links including satellite links, or other communication links or channels, such as may be known to those skilled in the art. Furthermore, a computing device or other related electronic devices may be remotely coupled to a network, such as via a wired or wireless line or link, for example.

For purposes of this disclosure, a "wireless network" should be understood to couple client devices with a network. A wireless network may employ stand-alone ad-hoc networks, mesh networks, Wireless LAN (WLAN) networks, cellular networks, or the like. A wireless network may further include a system of terminals, gateways, routers, or the like coupled by wireless radio links, or the like, which may move freely, randomly or organize themselves arbitrarily, such that network topology may change, at times even rapidly.

A wireless network may further employ a plurality of network access technologies, including Wi-Fi, Long Term Evolution (LTE), WLAN, Wireless Router (WR) mesh, or 2nd, 3rd, or 4th generation (2G, 3G, or 4G) cellular technology, or the like. Network access technologies may enable wide area coverage for devices, such as client devices with varying degrees of mobility, for example.

For example, a network may enable RF or wireless type communication via one or more network access technologies, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, 802.11b/g/n, or the like. A wireless network may include virtually any type of wireless communication mechanism by which signals may be communicated between devices, such as a client device or a computing device, between or within a network, or the like.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

For the purposes of this disclosure the term "user", "subscriber" "consumer" or "customer" should be understood to refer to a user of an application or applications as described herein and/or a consumer of data supplied by a data provider. By way of example, and not limitation, the term "user" or "subscriber" can refer to a person who receives data provided by the data or service provider over the Internet in a browser session, or can refer to an automated software application which receives the data and stores or processes the data.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
retrieving, by an application server, a message associated with a user identifier, the message including a body content portion;
spawning a server-less computing device, the spawning comprising transmitting the message to a server-less architecture and executing a processing job by the server-less architecture using the message;
retrieving, by the processing job, a parser configuration file based on a sender e-mail address or sender e-mail address domain associated with the message, the parser configuration file extracted from a database of parser configuration files, the database of parser configuration files storing a mapping of parser configuration files to sender email addresses or sender e-mail address domains;
generating, by the processing job, a parser based on the parser configuration file, the generating comprising building the parser for the message based on the identified parser configuration file in response to receiving the message at the server-less computing device;
parsing, by the processing job, the body content portion using the parser to identify an item of merchandise present within the body content portion, wherein the item of merchandise is associated with an item identifier and a set of item details;
transmitting, by the processing job, the item of merchandise to the application server;
storing, by the application server, the item of merchandise and the user identifier in a database of merchandise; and
generating, by the application server, a display listing merchandise associated with the user identifier, wherein the listing of merchandise includes the item of merchandise stored in the database of merchandise.

2. The method of claim 1 wherein the message comprises an e-mail message and wherein retrieving the message associated with the user identifier comprises accessing a user mailbox and retrieving an e-mail message from the user mailbox.

3. The method of claim 2 wherein retrieving the e-mail message from the user mailbox further comprises:
retrieving a set of e-mail messages in the user mailbox associated with the user identifier;
filtering the set of e-mail messages based on a pre-defined filter condition.

4. The method of claim 1 wherein parsing the body content portion to identify the item of merchandise present within the body content portion further comprises:
querying a third-party database of items using the item identifier;
receiving a set of supplemental item details from the third-party database of items, the set of supplemental item details associated with the item identifier; and
augmenting the item details with the supplemental item details.

5. The method of claim 1 wherein parsing the body content portion to identify the item of merchandise present within the body content portion further comprises:
identifying a merchant associated with the message;
identifying an agent associated with the merchant and the body content portion;
transforming the body content portion into a structured representation of the body content portion, wherein the structured representation of the body content portion includes a list of one or more items of merchandise included within the body content portion; and
selecting an item from the list of one or more items of merchandise as the item of merchandise.

6. The method of claim 5 wherein transforming the body content portion into a structured representation of the body content portion comprises transforming the body content portion using one of an XSLT (Extensible Stylesheet Language Transformations) transform, a DOM (Document Object Model) parsing algorithm, or a plurality of XPath (Extensible Markup Language Path Language) expressions.

7. The method of claim 1 wherein parsing the body content portion using the parser to identify the item of merchandise present within the body content portion further comprises:
identifying a third-party categorization of the item of merchandise, the third-party categorization including an ordered list of category numbers and corresponding category text;
if a last category number in the ordered list of category numbers matches a known category number, associating the item of merchandise with the known category number; and
if a first category number in the ordered list of category numbers matches a known category number:
determining whether the category text corresponding to the first category number matches a pre-defined expression,
selecting a set of subcategories associated with the pre-defined expression,
prompting the user to categorize the first item based on the set of subcategories, and
associating the item of merchandise with a selected one of the set of subcategories based on input received from the user in response to the prompting.

8. The method of claim 1 wherein the message comprises an image and wherein parsing the body content portion comprises:
extracting label data from the image via an OCR (Optical Character Recognition) procedure;
assigning a certainty to the label data, the certainty representing a level of accuracy of the OCR procedure;
identifying a plurality of hierarchal categories associated with the label data if the certainty of the label data is above a pre-defined threshold; and
associating the item of merchandise with one of the plurality of hierarchal categories.

9. The method of claim 8, wherein the plurality of images comprises a plurality of images of purchase receipts.

10. The method of claim 1 wherein the message comprises a webpage.

11. A system comprising:
an application server for retrieving a message, wherein the message is associated with a user identifier and includes a body content portion; and
a server-less computing device, spawned by a server-less architecture in response to receiving the message from the application server, for:
executing a processing job and associating the message with the processing job,
retrieving, by the processing job, a parser configuration file based on a sender e-mail address or sender e-mail address domain associated with the message, the parser configuration file extracted from a database of parser configuration files, the database of parser configuration files storing a mapping of parser configuration files to sender email addresses or sender e-mail address domains, generating, by the processing job, a parser based on the parser configuration file, the generating comprising building the parser for the message based on the identified parser configuration file in response to receiving the message at the server-less computing device, parsing, by the processing job, the body content portion to identify an item of merchandise present within the body content portion, wherein the item of merchandise is associated with an item identifier and a set of item details, and transmitting, by the processing job, the item of merchandise to the application server, wherein, in response to receiving the item of merchandise, the application server is configured to:

store the item of merchandise and the user identifier in a database of merchandise, and generate a display listing merchandise associated with the user identifier, wherein the listing of merchandise includes the item of merchandise stored in the database of merchandise.

12. The system of claim 11 wherein the message comprises an e-mail message and wherein retrieving a message comprises accessing a user mailbox located at a mail server and retrieving an e-mail message from the user mailbox.

13. The system of claim 11 wherein parsing the body content portion to identify the item of merchandise present within the body content portion:

querying a third-party database of items using the item identifier;

receiving a set of supplemental item details from the third-party database of items, the set of supplemental item details associated with the item identifier; and augmenting the item details with the supplemental item details.

14. The system of claim 11 wherein parsing the body content portion to identify the item of merchandise present within the body content portion further comprises:

identifying a merchant associated with the message;

identifying an agent associated with the merchant and the body content portion;

transforming the body content portion into a structured representation of the body content portion, wherein the structured representation of the body content portion includes a list of one or more items of merchandise included within the body content portion; and selecting an item from the list of one or more items of merchandise as the item of merchandise.

15. The system of claim 14 wherein transforming the body content portion into a structured representation of the body content portion comprises transforming the body content portion using one of an XSLT (Extensible Stylesheet Language Transformations) transform, a DOM (Document Object Model) parsing algorithm, or a plurality of XPath (Extensible Markup Language Path Language) expressions.

16. The system of claim 11 wherein parsing the body content portion to identify the item of merchandise present within the body content portion further comprises:

identifying a third-party categorization of the item of merchandise, the third-party categorization including an ordered list of category numbers and corresponding category text;

if a last category number in the ordered list of category numbers matches a known category number, associating the item of merchandise with the known category number; and if a first category number in the ordered list of category numbers matches a known category number:

determining whether the category text corresponding to the first category number matches a pre-defined expression, selecting a set of subcategories associated with the pre-defined expression, prompting the user to categorize the first item based on the set of subcategories, and associating the item of merchandise with a selected one of the set of subcategories based on input received from the user in response to the prompting.

17. The system of claim 11 wherein the message comprises an image and wherein parsing the body content portion comprises:

extracting label data from the image via an OCR (Optical Character Recognition) procedure;

assigning a certainty to the label data, the certainty representing a level of accuracy of the OCR procedure;

identifying a plurality of hierarchal categories associated with the label data if the certainty of the label data is above a pre-defined threshold; and associating the item of merchandise with one of the plurality of hierarchal categories.

18. The system of claim 17, wherein the plurality of images comprises a plurality of images of purchase receipts.

19. The system of claim 11 wherein the message comprises a webpage.

20. A method comprising:

retrieving, by an application server, a plurality of e-mail messages associated with a user identifier;

filtering, by the application server, the plurality of e-mail messages based on a pre-defined filter condition to obtain a set of filtered e-mail messages;

selecting, by the application server, a first e-mail message from the filtered e-mail messages;

extracting, by the application server, a body content portion of the first e-mail message;

spawning a server-less computing device, the spawning comprising transmitting the first e-mail message to a server-less architecture and executing a processing job by the server-less architecture using the message;

retrieving, by the processing job, a parser configuration file based on a sender e-mail address or sender e-mail address domain associated with the first e-mail message, the parser configuration file extracted from a database of parser configuration files, the database of parser configuration files storing a mapping of parser configuration files to sender email addresses or sender e-mail address domains;

generating, by the processing job, an XSLT (Extensible Stylesheet Language Transformations) transform associated with the first e-mail message based on the body content portion of the first e-mail message and a sender e-mail address associated with the first e-mail message, wherein the XSLT transform identifies a location or one or more items of merchandise within the body content portion of an e-mail message, the generating comprising building the XSLT transform for the first e-mail message based on the identified parser configuration file in response to receiving the first e-mail message at the server-less computing device;

parsing, by the processing job, the body content portion using the XSLT transform to identify an item of merchandise present within the body content portion, wherein the item of merchandise is associated with an item identifier and a set of item details;
transmitting, by the processing job, the item of merchandise to the application server;
storing, by the application server, the item of merchandise and the user identifier in a database of merchandise; and
generating, by the application server, a display listing merchandise associated with the user identifier, wherein the listing of merchandise includes the item of merchandise stored in the database of merchandise.

* * * * *